US008975986B2

(12) United States Patent
Iida et al.

(10) Patent No.: US 8,975,986 B2
(45) Date of Patent: Mar. 10, 2015

(54) HIGH-FREQUENCY SIGNAL TRANSMISSION LINE AND ELECTRONIC DEVICE

(71) Applicant: Murata Manufacturing Co., Ltd., Nagaokakyo-shi, Kyoto-fu (JP)

(72) Inventors: Kanto Iida, Nagaokakyo (JP); Yoichi Saito, Nagaokakyo (JP); Satoshi Sasaki, Nagaokakyo (JP); Noboru Kato, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/196,269

(22) Filed: Mar. 4, 2014

(65) Prior Publication Data
US 2014/0184359 A1   Jul. 3, 2014

Related U.S. Application Data

(63) Continuation of application No. PCT/JP2013/050935, filed on Jan. 18, 2013.

(30) Foreign Application Priority Data

Jan. 31, 2012 (JP) ................................. 2012-018229

(51) Int. Cl.
*H01P 3/08* (2006.01)
*H03H 7/38* (2006.01)
(Continued)

(52) U.S. Cl.
CPC ................ *H01P 3/082* (2013.01); *H05K 1/115* (2013.01); *H05K 1/0225* (2013.01); *H05K 1/0271* (2013.01); *H05K 2201/09709* (2013.01)
USPC ............................................ 333/238; 333/33

(58) Field of Classification Search
USPC ................................. 333/238, 246, 33, 1, 4, 5
See application file for complete search history.

(56) References Cited

U.S. PATENT DOCUMENTS 6,518,864 B1 * 2/2003 Ito et al. ......................... 333/238
7,626,476 B2 * 12/2009 Kim et al. ...................... 333/238
(Continued)

FOREIGN PATENT DOCUMENTS

CN   101069458 A   11/2007
JP   3173143 U   1/2012
(Continued)

OTHER PUBLICATIONS

Official Communication issued in corresponding Chinese Patent Application No. 201380002522.9, mailed on Jun. 24, 2014.
(Continued)

*Primary Examiner* — Stephen E Jones
(74) *Attorney, Agent, or Firm* — Keating & Bennett, LLP

(57) ABSTRACT

A high-frequency signal transmission line includes a flexible body including a plurality of insulating layers. A linear signal line is located in or on the body. A first ground conductor is located opposite to the signal line via at least one of the insulating layers. A second ground conductor extends along the signal line. An interlayer connection portion that connects the first ground conductor and the second ground conductor includes a plurality of interlayer connection conductors individually pierced in some of6 the insulating layers and connected to each other. The plurality of interlayer connection conductors includes two interlayer connection conductors that are pierced in adjacent ones of the insulating layers with respect to a layer-stacking direction and that have central axes located in different positions when viewed from the layer-stacking direction.

27 Claims, 15 Drawing Sheets

(51) Int. Cl.
*H05K 1/11* (2006.01)
*H05K 1/02* (2006.01)

(56) References Cited

U.S. PATENT DOCUMENTS

2007/0096328 A1 5/2007 Takahashi et al.
2014/0048312 A1 2/2014 Kato et al.

FOREIGN PATENT DOCUMENTS

WO 2007/007857 A1 1/2007
WO 2011/007660 A1 1/2011

OTHER PUBLICATIONS

Official Communication issued in International Patent Application No. PCT/JP2013/050935, mailed on Apr. 23, 2013.

* cited by examiner

F I G. 1 A
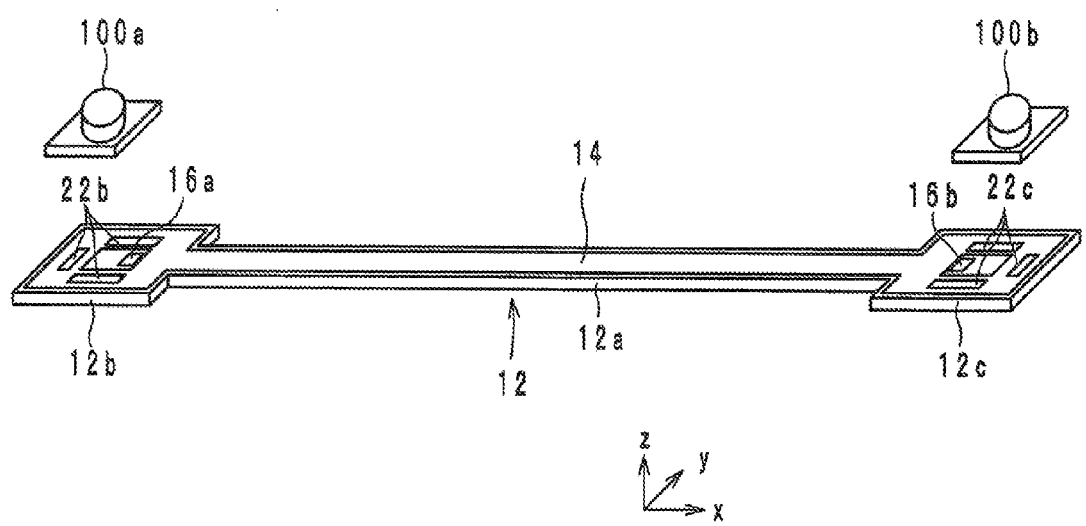
F I G. 1 B
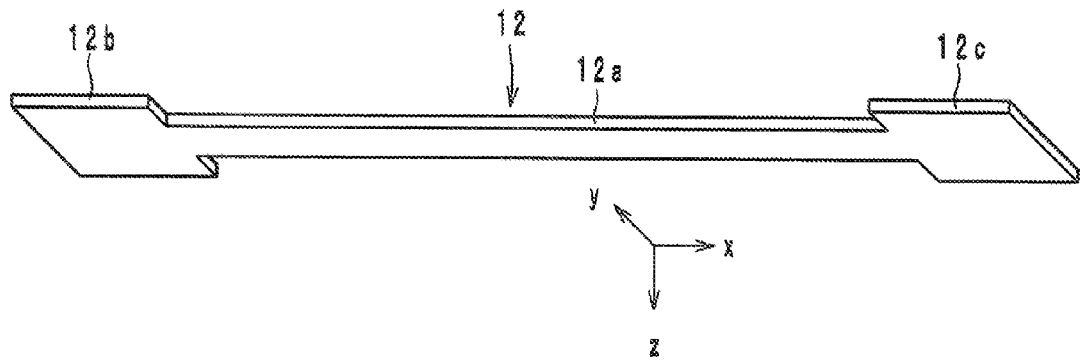
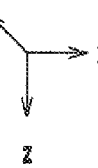

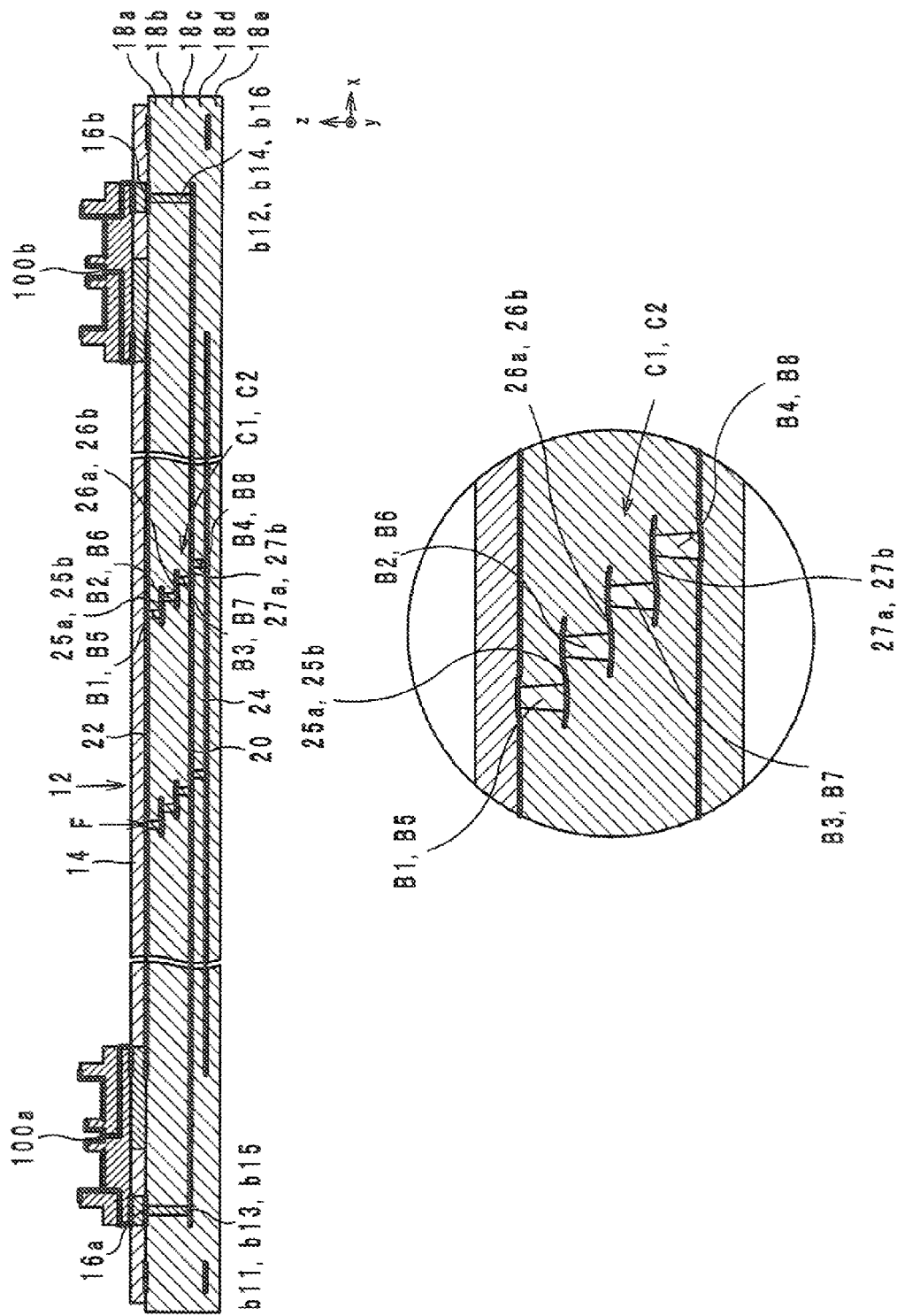

HIGH-FREQUENCY SIGNAL TRANSMISSION LINE AND ELECTRONIC DEVICE

BACKGROUND OF THE INVENTION

1. Field of the Invention

The present invention relates to a high-frequency transmission signal line and an electronic device, and more particularly to a high-frequency signal transmission line that transmits a high-frequency signal, and an electronic device.

2. Description of the Related Art

A conventional high-frequency signal transmission line, for example, a signal transmission line disclosed in WO2011/007660 is known. The signal transmission line includes a laminate body, a signal line, a first ground conductor, a second ground conductor and via-hole conductors. The laminate body is formed by stacking a plurality of insulating layers. The signal line is a linear conductor located in the laminate body. The first ground conductor and the second ground conductor are stacked together with the insulating layers so as to be located on opposite sides from the signal line. The signal line, the first ground conductor and the second ground conductor form a stripline structure. The via-hole conductors are pierced in the insulating layers so as to connect the first ground conductor and the second ground conductor.

The signal transmission line disclosed in WO2011/007660 has a problem that the laminate body is hard to bend. FIG. 15 is a sectional view of the signal transmission line 500 disclosed in WO2011/007660, showing the via-hole conductors B502 and B504. In the signal transmission line 500, the via-hole conductors B502 and B504 are connected linearly, and a plurality of sets of linearly-connected via-hole conductors B502 and B504 are provided. When the laminate body 502 is bent such that the center portion of the laminate body 502 will project upward, an insulating layer 502a located at an upper side is pulled to the right and left, and an insulating layer 502d located at a lower side is pressed from right and left. In this moment, with a restoring force of the insulating layers 502a and 502d, the via-hole conductors B502 and B504 are forced from above and underneath as shown by arrows F. By the force F, the via-hole conductors B502 and B504 lean to the right or left as shown by arrow α. In this way, the laminate body 502 is bent.

However, as shown in FIG. 15, the force F has almost no components to push the via-hole conductors B502 and B504 to the right or left. Therefore, in order to tilt the via-hole conductors B502 and B504 to the right or left, thereby bending the laminate body 502, it is necessary to apply a great force F to the via-hole conductors B502 and B504. Thus, the laminate body 502 of the signal transmission line 500 disclosed in WO2011/007660 is hard to bend.

SUMMARY OF THE INVENTION

Preferred embodiments of the present invention provide a flexible high-frequency signal transmission line, and an electronic device.

A high-frequency signal transmission line according to a preferred embodiment includes a flexible body including a plurality of insulating layers stacked on each other; a linear signal line located in or on the body; a first ground conductor located opposite to the signal line via at least one of the insulating layers; a second ground conductor extending along the signal line; and an interlayer connection portion that connects the first ground conductor and the second ground conductor, the interlayer connection portion includes a plurality of interlayer connection conductors individually pierced in some of the insulating layers and connected to each other, the plurality of interlayer connection conductors including two interlayer connection conductors that are pierced in two adjacent ones of the insulating layers with respect to a layer-stacking direction and that have central axes located in different positions when viewed from the layer-stacking direction.

An electronic device according to a preferred embodiment of the present invention includes a high-frequency signal transmission line; and a casing encasing the high-frequency signal transmission line. The high-frequency signal transmission line includes a flexible body including a plurality of insulating layers stacked on each other; a linear signal line located in or on the body; a first ground conductor located opposite to the signal line via at least one of the insulating layers; a second ground conductor extending along the signal line; and an interlayer connection portion that connects the first ground conductor and the second ground conductor, the interlayer connection portion including a plurality of interlayer connection conductors pierced in some of the insulating layers individually and connected to each other.

The interlayer connection portion includes at least two interlayer connection conductors pierced in adjacent ones of the insulating layers with respect to a layer-stacking direction and having central axes located in different positions when viewed from the layer-stacking direction.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 1A and 1B are perspective views of a high-frequency signal transmission line according to a preferred embodiment of the present invention.

FIG. 3 is a sectional view of the high-frequency signal transmission line according to a preferred embodiment of the present invention.

DETAILED DESCRIPTION OF THE PREFERRED EMBODIMENTS

A high-frequency signal transmission line and an electronic device according to preferred embodiments of the present invention will be hereinafter described with reference to the drawings.

Figure 2:
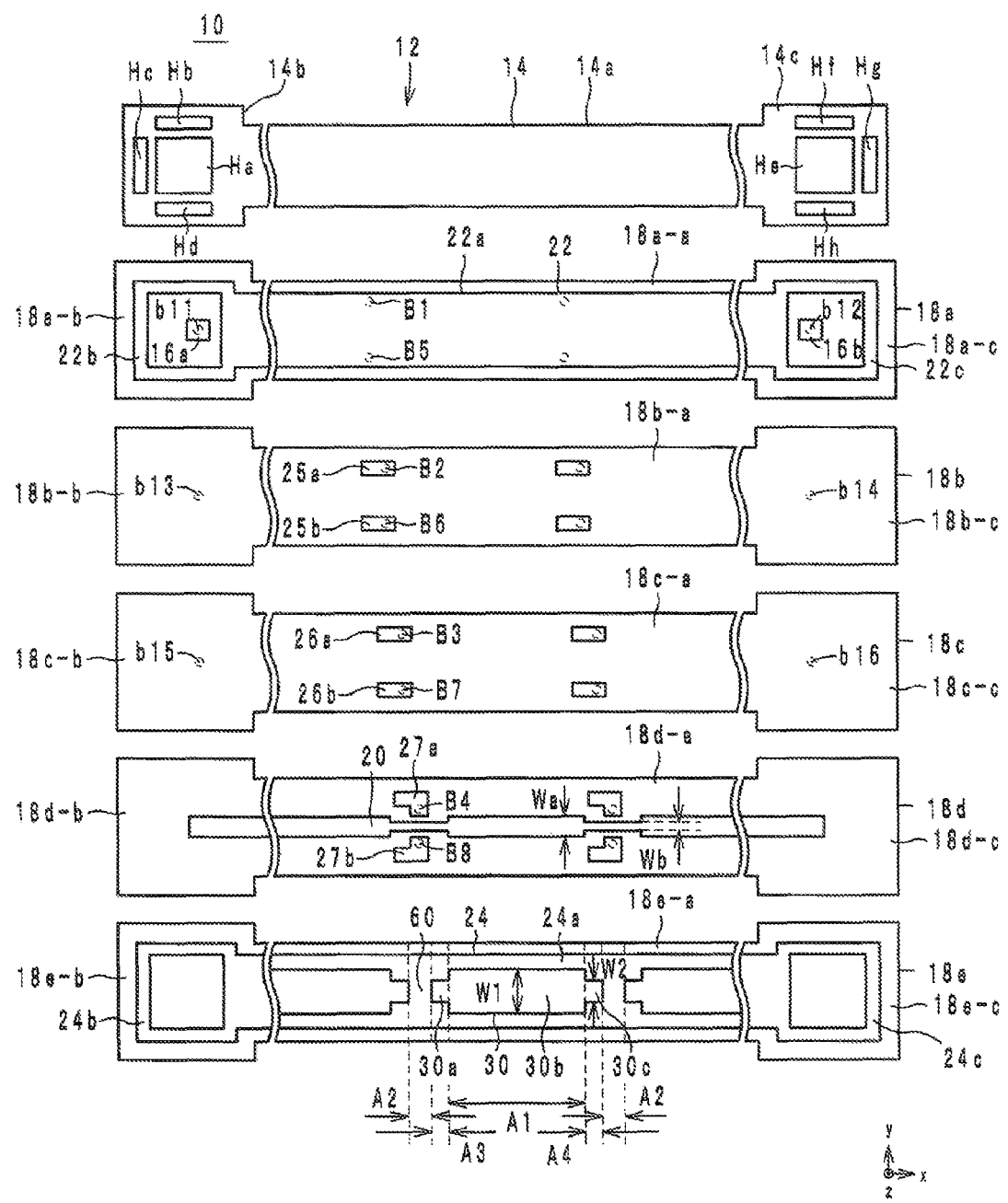
FIG. 2 is an exploded view of a dielectric body of the high-frequency signal transmission line according to a preferred embodiment of the present invention.

The structure of a high-frequency signal transmission line according to a preferred embodiment of the present invention is described. FIG. 1 is a perspective view of a high-frequency signal transmission line 10 according to a preferred embodiment of the present invention. FIG. 2 is an exploded view of a dielectric body 12 of the high-frequency signal transmission line 10. FIG. 3 is a sectional view of the high-frequency signal transmission line 10. In FIG. 3, via-hole conductors B1 to B4 connected via connection conductors 25$a$, 26$a$ and 27$a$ and 27$b$, and via-hole conductors B5 to B8 connected via connection conductors 25$b$, 26$b$ and 27$b$ are shown in the same position. In FIGS. 1 to 3, a layer-stacking direction of the laminate body 12 is defined as a z-axis direction. The lengthwise direction of the high-frequency signal transmission line 10 is defined as an x-axis direction. A direction perpendicular to the x-axis direction and the z-axis direction is defined as a y-axis direction.

The high-frequency signal transmission line 10, as shown by FIGS. 1 to 3, includes a dielectric body 12, external terminals 16 (16$a$ and 16$b$), a signal line 20, ground conductors 22 and 24, interlayer connection portions C1 and C2 (see FIG. 3), and connectors 100$a$ and 100$b$.

The dielectric body 12, when viewed from the z-axis direction, extends in the x-axis direction and includes a line portion 12$a$, and connector portions 12$b$ and 12$c$. The dielectric body 12 is a flexible laminate body including a protective layer 14 and dielectric sheets (insulating layers) 18 (18$a$ to 18$e$) stacked in this order from a positive side to a negative side in the z-axis direction. In the following, a main surface of the dielectric body 12 located at the positive z-axis side is referred to as a front surface of the dielectric body 12, and a main surface of the dielectric body 12 located at the negative z-axis side is referred to as a back surface of the dielectric body 12.

The line portion 12$a$ extends in the x-axis direction. The connector portions 12$b$ and 12$c$ are rectangular or substantially rectangular and are connected to a negative x-axis end and at a positive x-axis end of the line portion 12$a$, respectively. The sizes in the y-axis direction (widths) of the connector portions 12$b$ and 12$c$ are greater than the size in the y-axis direction of the line portion 12$a$.

The dielectric sheets 18, when viewed from the z-axis direction, extend in the x-axis direction and preferably have the same or substantially the same shape as the dielectric body 12. The dielectric sheets 18 are made of flexible thermoplastic resin such as polyimide, liquid polymer or the like. Each of the dielectric sheets 18 after lamination has a thickness of, for example, about 50 μm. In the following, a main surface of each of the dielectric sheets 18 located at the positive z-axis side is referred to as a front surface, and a main surface of each of the dielectric sheets 18 located at the negative z-axis side is referred to as a back surface.

The dielectric sheets 18$a$ includes a line portion 18$a$-$a$, and connector portions 18$a$-$b$ and 18$a$-$c$. The dielectric sheet 18$b$ includes a line portion 18$b$-$a$, and connector portions 18$b$-$b$ and 18$b$-$c$. The dielectric sheets 18$c$ includes a line portion 18$c$-$a$, and connector portions 18$c$-$b$ and 18$c$-$c$. The dielectric sheet 18$d$ includes a line portion 18$d$-$a$, and connector portions 18$d$-$b$ and 18$d$-$c$. The dielectric sheet 18$e$ includes a line portion 18$e$-$a$, and connector portions 18$e$-$b$ and 18$e$-$c$. The line portions 18$a$-$a$, 18$b$-$a$, 18$c$-$a$, 18$d$-$a$ and 18$e$-$a$ define the line portion 12$a$ of the dielectric body 12. The connector portions 18$a$-$b$, 18$b$-$b$, 18$c$-$b$, 18$d$-$b$ and 18$e$-$b$ define the connector portion 12$b$ of the dielectric body 12. The connector portions 18$a$-$c$, 18$b$-$c$, 18$c$-$c$, 18$d$-$c$ and 18$e$-$c$ define the connector portion 12$c$ of the dielectric body.

The external terminal 16$a$ is, as shown in FIGS. 1 and 2, a rectangular or substantially rectangular conductor provided on the front surface of the connector portion 18$a$-$b$ to be located around the center of the connector portion 18$a$-$b$. The external terminal 16$b$ is, as shown in FIGS. 1 and 2, a rectangular or substantially rectangular conductor provided on the front surface of the connector portion 18$a$-$c$ to be located substantially in the center of the connector portion 18$a$-$c$. The external terminals 16$a$ and 16$b$ are made of a metal material with a relatively small specific resistance, such as a silver-based material, a copper-based material or the like. The external terminals 16$a$ and 16$b$ are preferably plated with gold.

The signal line 20 is, as shown in FIG. 2, a linear conductor provided in the dielectric sheet 12, and more specifically, the signal line 20 is provided on the front surface of the dielectric sheet 18$d$ to extend in the x-axis direction. Both ends of the signal line 20 are located to overlap with the external terminals 16$a$ and 16$b$ when viewed from the z-axis direction. The signal line 20 is made of a metal material with a relatively small specific resistance, such as a silver-based material, a copper-based material or the like.

Via-hole conductors b11, b13 and b15 are pierced in the connector portions 18$a$-$b$, 18$b$-$b$ and 18$c$-$b$ of the dielectric sheets 18$a$, 18$b$ and 18$c$, respectively, in the z-axis direction. The via-hole conductors b11, b13 and b15 are connected to each other to serve as a single via-hole conductor to connect the external terminal 16$a$ to the negative x-axis end of the signal line 20.

Via-hole conductors b12, b14 and b16 are pierced in the connector portions 18$a$-$c$, 18$b$-$c$ and 18$c$-$c$ of the dielectric sheets 18$a$, 18$b$ and 18$c$, respectively, in the z-axis direction. The via-hole conductors b12, b14 and b16 are connected to each other to serve as a single via-hole conductor to connect the external terminal 16$b$ to the positive x-axis end of the signal line 20. The via-hole conductors b11 to b16 are made of a metal material with a relatively small specific resistance, such as a silver-based material, a copper-based material or the like.

The ground conductor 22 (first ground conductor) is, as shown in FIGS. 2 and 3, provided in the dielectric body 12 so as to be located at the positive z-axis side of the signal line 20. More specifically, the ground conductor 22 is provided on the front surface of the dielectric sheet 18$a$. Thus, the ground conductor 22 is located on the front surface of the dielectric sheet 18$a$ to extend in the x-axis direction along the signal line 20, and as shown in FIG. 2, the ground conductor 22 is opposed to the signal line 20 via the dielectric sheets 18a to 18c.

The ground conductor 22 includes a line portion 22a, and terminal portions 22b and 22c. The line portion 22a is provided on the front surface of the line portion 18a-a of the dielectric sheet 18a to extend in the x-axis direction. The line portion 22a has substantially no openings. That is, the line portion 22a is a continuous electrode that is located in the line portion 12a of the dielectric body 12 to continuously extend in the x-axis direction along the signal line 20. The line portion 22a does not necessarily cover the entire front surface of the line portion 18a-a. For example, the line portion 22a may have a small hole at a specified position to release a gas generated at the time of thermocompression bonding of the dielectric sheets 18. The line portion 22a is made of a metal material with a relatively small specific resistance, such as a silver-based material, a copper-based material or the like.

The characteristic impedance of the high-frequency signal transmission line 10 depends on mainly the area where the signal line 20 and the ground conductor 22 are opposed to each other, the distance between the signal line 20 and the ground conductor 22, and the relative permittivity of the dielectric sheets 18a to 18e. Therefore, when the high-frequency signal transmission line 10 is desired to have a characteristic impedance of 50Ω, for example, the signal line 20 and the ground conductor 22 are designed to cause the high-frequency signal transmission line 10 to have a characteristic impedance of 55Ω, for example, which is a little higher than the desired value. Thereafter, the shape of the ground conductor 24, which will be described later, is adjusted such that the signal line 20, the ground conductor 22 and the ground conductor 24 cause the high-frequency signal transmission line 10 to have a characteristic impedance of 50Ω. Thus, the ground conductor 22 is a primary ground conductor.

The terminal portion 22b of the ground conductor 22 is located on the front surface of the connector portion 18a-b of the dielectric sheet 18a and is in the shape of a rectangular or substantially rectangular or substantially rectangular loop enclosing the external terminal 16a. The terminal portion 22b is connected to the negative x-axis end of the line portion 22a. The terminal portion 22c is located on the front surface of the connector portion 18a-c of the dielectric sheet 18a and is in the shape of a rectangular or substantially rectangular or substantially rectangular loop enclosing the external terminal 16b. The terminal portion 22b is connected to the positive x-axis end of the line portion 22a.

The ground conductor 24 (second ground conductor), as shown in FIGS. 2 and 3, extends in the x-axis direction along the signal line 20. The ground conductor 24 is provided in the dielectric body 12 so as to be located at the negative z-axis side of the signal line 20 (on an opposite side of the signal line 20 from the ground conductor 22). More specifically, the ground conductor 24 is provided on the front surface of the dielectric sheet 18e. Thus, the ground conductor 24 is located on the front surface of the dielectric sheet 18e to extend in the x-axis direction along the signal line 20, and as shown in FIG. 2, the ground conductor 24 is opposed to the signal line 20 via the dielectric sheet 18d. The ground conductor 24 is made of a metal material with a relatively small specific resistance, such as a silver-based material, a copper-based material or the like.

The ground conductor 24 includes a line portion 24a, and terminal portions 24b and 24c. The line portion 24a is provided on the front surface of the line portion 18e-a of the dielectric sheet 18e to extend in the x-axis direction. The line portion 24a has a plurality of openings 30 where the conductive layer is missing and a plurality of bridges 60 where the conductive layer is present. The openings 30 and the bridges 60 are arranged alternately at uniform intervals along the signal line 20, and accordingly, the line portion 24a is in the shape of a ladder. The openings 30 are, as shown in FIG. 2, located to overlap with the signal line 20 when viewed from the z-axis direction. Therefore, the signal line 20, when viewed from the z-axis direction, extends in the x-axis direction while crossing over the openings 30 and the bridges 60 alternately.

Now, the shape of the openings 30 is described. Each of the openings 30 includes opening portions 30a, 30b and 30c. The opening portion 30b is a rectangular or substantially rectangular portion with its longer sides extending in the x-axis direction. The opening portion 30a is a rectangular or substantially rectangular portion located at the negative x-axis side of the opening portion 30b. The opening portion 30c is a rectangular or substantially rectangular portion located at the positive x-axis side of the opening portion 30b. The size in the y-axis direction (width) W1 of the opening portion 30b is greater than the size in the y-axis direction W2 of the opening portions 30a and 30c. Accordingly, each of the openings 30 is in the shape of a cross. The signal line 20, when viewed from the z-axis direction, crosses the centers of the openings 30 with respect to the y-axis direction.

In the following, in the high-frequency signal transmission line 10, the areas where the opening portions 30b are located are referred to as areas A1, and the areas where the bridges 60 are located are referred to as areas A2. The area where the opening portions 30a are located are referred to as areas A3, and the area where the opening portions 30c are located are referred to as areas A4.

The terminal portion 24b is located on the front surface of the connector portion 18e-b of the dielectric sheet 18e and is in the shape of a rectangular or substantially rectangular loop enclosing the center of the connector portion 18e-b. The terminal portion 24b is connected to the negative x-axis end of the line portion 24a.

The terminal portion 24c is located on the front surface of the connector portion 18e-c of the dielectric sheet 18e and is in the shape of a rectangular or substantially rectangular loop enclosing the center of the connector portion 18e-c. The terminal portion 24c is connected to the positive x-axis end of the line portion 24c.

The ground conductor 24 is an auxiliary ground conductor functioning also as a shield. As mentioned above, the ground conductor 24 is designed for final adjustment of the characteristic impedance such that the characteristic impedance of the high-frequency signal transmission line 10 will be finally 50Ω. Specifically, the size of the openings and the width of the bridges 60 are designed for a specific purpose.

As thus far described, the ground conductor 22 has no openings, while the ground conductor 24 has the openings 30. Therefore, the area where the ground conductor 24 is opposed to the signal line 20 is smaller than the area where the ground conductor 22 is opposed to the signal line 20.

As shown in FIG. 2, the line width Wa of the signal line 20 in the areas A1 is greater than the line width Wb of the signal line 20 in the areas A2, A3 and A4. In the areas A1, the distance between the signal line 20 and the ground conductor 24 is greater, and the high-frequency resistance (conductor loss) of the signal line 20 is reduced by increasing the line width to Wa. On the other hand, in the areas A2, A3 and A4, the distance between the signal line 20 and the ground conductor 24 is smaller, and a reduction in impedance of the signal line 20 is alleviated by decreasing the line width to Wb.

The interlayer connection portions C1, which are to connect the line portion 22a of the ground conductor 22 to the line portion 24a of the ground conductor 24, are arranged in a line along the x-axis at the positive y-axis side of the signal line 20. Each of the interlayer connection portions C1 is formed by connecting a series of via-hole conductors (interlayer conductors) B1 to B4 and connection conductors 25a to 27a.

The via-hole conductors B1 pierced in the line portion 18a-a of the dielectric sheet 18a in the z-axis direction are arranged in a line along the x-axis at the positive y-axis side of the signal line 20. The via-hole conductors B2 pierced in the line portion 18b-a of the dielectric sheet 18b in the z-axis direction are arranged in a line along the x-axis at the positive y-axis side of the signal line 20. The central axis of each of the via-hole conductors B2 shifts in the positive x-axis direction from the central axis of its adjacent via-hole conductor B1. The via-hole conductors B3 pierced in the line portion 18c-a of the dielectric sheet 18c in the z-axis direction are arranged in a line along the x-axis at the positive y-axis side of the signal line 20. The central axis of each of the via-hole conductors B3 shifts in the positive x-axis direction from the central axis of its adjacent via-hole conductor B2. The via-hole conductors B4 pierced in the line portion 18d-a of the dielectric sheet 18d in the z-axis direction are arranged in a line along the x-axis at the positive y-axis side of the signal line 20. The central axis of each of the via-hole conductors B4 shifts in the positive x-axis direction from the central axis of its adjacent via-hole conductor B3. The via-hole conductors B1 to B4 are made of a metal material with a relatively small specific resistance, such as a silver-based material, a copper-based material or the like.

Thus, in each of the interlayer connection portions C1, the central axes of two arbitrary adjacent ones of the via-hole conductors B1 to B4 pierced in two adjacent ones of the dielectric sheets 18a to 18d are located in different positions when viewed from the z-axis direction. Specifically, in each of the interlayer connection portions C1, the central axis of the via-hole conductor B1 is located in a different position from the central axis of the via-hole conductor B2 when viewed from the z-axis direction. The central axis of the via-hole conductor B2 is located in a different position from the central axis of the via-hole conductor B1 and the central axis of the via-hole conductor B3 when viewed from the z-axis direction. The central axis of the via-hole conductor B3 is located in a different position from the central axis of the via-hole conductor B2 and the central axis of the via-hole conductor B4 when viewed from the z-axis direction. The central axis of the via-hole conductor B4 is located in a different position from the central axis of the via-hole conductor B3 when viewed from the z-axis direction.

In the high-frequency signal transmission line 10, in each of the interlayer connection portions C1, the central axes of all of the via-hole conductors B1 to B4 are located in different positions from each other when viewed from the z-axis direction. The central axes of the via-hole conductors B1 to B4 are arranged in this order from the negative x-axis side to the positive x-axis side along the signal line 20 when viewed from the z-axis direction.

The connection conductors 25a are provided on the front surface of the line portion 18b-a of the dielectric sheet 18b to be arranged in a line along the x-axis at the positive y-axis side of the signal line 20. Each of the connection conductors 25a preferably is rectangular or substantially rectangular with its longer sides extending in the x-axis direction and connects its adjacent via-hole conductors B1 and B2, of which central axes shift from each other in the x-axis direction. The negative z-axis end of the via-hole conductor B1 is connected to the negative x-axis side of the connection conductor 25a, and the positive z-axis end of the via-hole conductor B2 is connected to the positive x-axis side of the connection conductor 25a.

The connection conductors 26a are provided on the front surface of the line portion 18c-a of the dielectric sheet 18c to be arranged in a line along the x-axis at the positive y-axis side of the signal line 20. Each of the connection conductors 26a preferably is rectangular or substantially rectangular with its longer sides extending in the x-axis direction and connects its adjacent via-hole conductors B2 and B3, of which central axes shift from each other in the x-axis direction. The negative z-axis end of the via-hole conductor B2 is connected to the negative x-axis side of the connection conductor 26a, and the positive z-axis end of the via-hole conductor B3 is connected to the positive x-axis side of the connection conductor 26a.

The connection conductors 27a are provided on the front surface of the line portion 18d-a of the dielectric sheet 18d to be arranged in a line along the x-axis at the positive y-axis side of the signal line 20. Each of the connection conductors 27a preferably is L-shaped or substantially L-shaped and connects its adjacent via-hole conductors B3 and B4, of which central axes shift from each other in the x-axis direction. The negative z-axis end of the via-hole conductor B3 is connected to the negative x-axis side of the connection conductor 27a, and the positive z-axis end of the via-hole conductor B4 is connected to the positive x-axis side of the connection conductor 27a.

Each of the interlayer connection portions C1 is, as shown in FIG. 3, shaped like stairs leading to the negative z-axis side while tracing in the positive x-axis direction. In the high-frequency signal transmission line 10 according to this preferred embodiment, preferably all of the interlayer connection portions C1 tilt in the same direction.

The interlayer connection portions C2, which are to connect the line portion 22a of the ground conductor 22 to the line portion 24a of the ground conductor 24, are arranged in a line along the x-axis at the negative y-axis side of the signal line 20. Each of the interlayer connection portions C2 is provided by connecting a series of via-hole conductors (interlayer conductors) B5 to B8 and connection conductors 25b to 27b.

The via-hole conductors B5 pierced in the line portion 18a-a of the dielectric sheet 18a in the z-axis direction are arranged in a line along the x-axis at the negative y-axis side of the signal line 20. The via-hole conductors B6 pierced in the line portion 18b-a of the dielectric sheet 18b in the z-axis direction are arranged in a line along the x-axis at the negative y-axis side of the signal line 20. Each of the via-hole conductors B6 is located such that the central axis of the via-hole conductor B6 shifts in the positive x-axis direction from the central axis of its adjacent via-hole conductor B5. The via-hole conductors B7 pierced in the line portion 18c-a of the dielectric sheet 18c in the z-axis direction are arranged in a line along the x-axis at the negative y-axis side of the signal line 20. Each of the via-hole conductors B7 is located such that the central axis of the via-hole conductor B7 shifts in the positive x-axis direction from the central axis of its adjacent via-hole conductor B6. The via-hole conductors B8 pierced in the line portion 18d-a of the dielectric sheet 18d in the z-axis direction are arranged in a line along the x-axis at the negative y-axis side of the signal line 20. Each of the via-hole conductors B8 is located such that the central axis of the via-hole conductor B8 shifts in the positive x-axis direction from the central axis of its adjacent via-hole conductor B7.

Thus, in each of the interlayer connection portions C2, the central axes of each two arbitrary adjacent ones of the via-hole conductors B5 to B8 pierced in two adjacent ones of the dielectric sheets 18a to 18d are located in different positions when viewed from the z-axis direction. Specifically, in each of the interlayer connection portions C2, the central axis of the via-hole conductor B5 is located in a different position from the central axis of the via-hole conductor B6 when viewed from the z-axis direction. The central axis of the via-hole conductor B6 is located in a different position from the central axis of the via-hole conductor B5 and the central axis of the via-hole conductor B7 when viewed from the z-axis direction. The central axis of the via-hole conductor B7 is located in a different position from the central axis of the via-hole conductor B6 and the central axis of the via-hole conductor B8 when viewed from the z-axis direction. The central axis of the via-hole conductor B8 is located in a different position from the central axis of the via-hole conductor B7 when viewed from the z-axis direction. The via-hole conductors B5 to B8 are made of a metal material with a relatively small specific resistance, such as a silver-based material, a copper-based material or the like.

In the high-frequency signal transmission line 10, in each of the interlayer connection portions C2, the central axes of all of the via-hole conductors B5 to B8 are located in different positions from each other when viewed from the z-axis direction. The central axes of the via-hole conductors B5 to B8 are arranged in this order from the negative x-axis side to the positive x-axis side along the signal line 20 when viewed from the z-axis direction.

The connection conductors 25b are provided on the front surface of the line portion 18b-a of the dielectric sheet 18b to be arranged in a line along the x-axis at the negative y-axis side of the signal line 20. Each of the connection conductors 25b preferably is rectangular or substantially rectangular with its longer sides extending in the x-axis direction and connects its adjacent via-hole conductors B5 and B6, of which central axes shift from each other in the x-axis direction. The negative z-axis end of the via-hole conductor B5 is connected to the negative x-axis side of the connection conductor 25b, and the positive z-axis end of the via-hole conductor B6 is connected to the positive x-axis side of the connection conductor 25b.

The connection conductors 26b are provided on the front surface of the line portion 18c-a of the dielectric sheet 18c to be arranged in a line along the x-axis at the positive y-axis side of the signal line 20. Each of the connection conductors 26b preferably is rectangular or substantially rectangular with its longer sides extending in the x-axis direction and connects its adjacent via-hole conductors B6 and B7, of which central axes shift from each other in the x-axis direction. The negative z-axis end of the via-hole conductor B6 is connected to the negative x-axis side of the connection conductor 26b, and the positive z-axis end of the via-hole conductor B7 is connected to the positive x-axis side of the connection conductor 26b.

The connection conductors 27b are provided on the front surface of the line portion 18d-a of the dielectric sheet 18d to be arranged in a line along the x-axis at the negative y-axis side of the signal line 20. Each of the connection conductors 27b preferably is L-shaped or substantially L-shaped and connects its adjacent via-hole conductors B7 and B8, of which central axes shift from each other in the x-axis direction. The negative z-axis end of the via-hole conductor B7 is connected to the negative x-axis side of the connection conductor 27b, and the positive z-axis end of the via-hole conductor B8 is connected to the positive x-axis side of the connection conductor 27b.

Each of the interlayer connection portions C2 preferably is, as shown in FIG. 3, shaped like stairs leading to the negative z-axis side while tracing in the positive x-direction. In the high-frequency signal transmission line 10 according to this preferred embodiment, preferably all of the interlayer connection portions C2 tilt in the same direction.

Each of the interlayer connection portions C1 and C2 is connected to the ground conductor 24, in one of the areas A2 that is located between two adjacent openings 30. In other words, the negative z-axis end of each of the via-hole conductors B4 and B8 is connected to one of the bridges 60.

Thus, the signal line 20 and the ground conductors 22 and 24 define a triplate stripline structure. The distance between the signal line 20 and the ground conductor 22 is equal or substantially equal to the total of the thicknesses of the dielectric sheets 18a to 18c and, for example, within a range from about 50 µm to about 300 µm. In this preferred embodiment, the distance between the signal line 20 and the ground conductor 22 preferably is about 150 µm, for example. The distance between the signal line 20 and the ground conductor 24 preferably is equal or substantially equal to the thickness of the dielectric sheet 18d and, for example, within a range from about 10 µm to about 100 µm. In this preferred embodiment, the distance between the signal line 20 and the ground conductor 24 preferably is about 50 µm, for example. Thus, the dielectric sheets 18a to 18d are designed such that the total of the thicknesses of the dielectric sheets 18a to 18c is greater than the thickness of the dielectric sheet 18d. The ground conductors 22 and 24 both have a size in the y-axis direction (width) of, for example, about 800 µm. Accordingly, the high-frequency signal transmission line 10 is thin and wide.

The protective layer 14 covers substantially the entire front surface of the dielectric sheet 18a. As a result, the ground conductor 22 is covered by the protective layer 14. The protective layer 14 is made of, for example, flexible resin such as a resist material or the like.

The protective layer 14, as shown by FIG. 2, includes a line portion 14a, and connector portions 14b and 14c. The line portion 14a covers the entire front surface of the line portion 18a-a of the dielectric sheet and thus covers the line portion 22a of the ground conductor 22.

The connector portion 14b is connected to the negative x-axis end of the line portion 14a and covers the front surface of the connector portion 18a-b. However, the connector portion 14b has openings Ha to Hd. The opening Ha is a rectangular or substantially rectangular opening made substantially in the center of the connector portion 14b. The external terminal 16a is exposed on the outside through the opening Ha. The opening Hb is a rectangular or substantially rectangular opening located at the positive y-axis side of the opening Ha. The opening Hc is a rectangular or substantially rectangular opening located at the negative x-axis side of the opening Ha. The opening Hd is a rectangular or substantially rectangular opening located at the negative y-axis side of the opening Ha. The terminal portion 22b of the ground conductor 22 is exposed on the outside through the openings Hb to Hd, and functions as an external terminal.

The connector portion 14c is connected to the positive x-axis end of the line portion 14a and covers the front surface of the connector portion 18a-c. However, the connector portion 14c has openings He to Hh. The opening He is a rectangular or substantially rectangular opening made substantially in the center of the connector portion 14c. The external terminal 16b is exposed on the outside through the opening He. The opening Hf is a rectangular or substantially rectangular opening located at the positive y-axis side of the opening He. The opening Hg is a rectangular or substantially rectangular opening located at the positive x-axis side of the opening He. The opening Hh is a rectangular or substantially rectangular opening located at the negative y-axis side of the opening He.

The terminal portion 22b is exposed on the outside through the openings Hb to Hd, and functions as an external terminal.

Figure 4A:
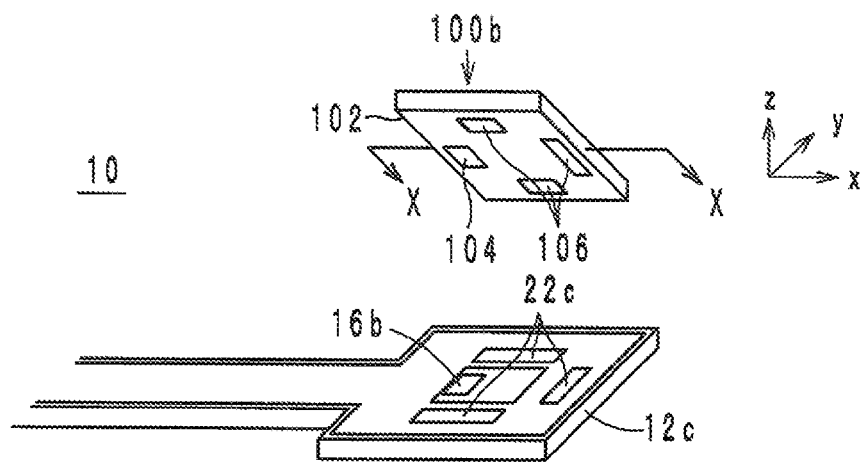
FIGS. 4A and 4B are a perspective view and a sectional view, respectively, of a connector.
Figure 4B:
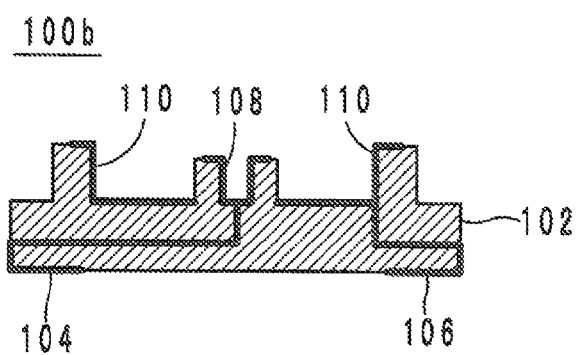

The connectors 100a and 100b are mounted on the connector portions 12b and 12c, respectively, and are electrically connected to the signal line 20, and the ground conductors 22 and 24. The connectors 100a and 100b preferably have the same structure, and only the connector 100b will be hereinafter described. FIGS. 4A and 4B area perspective view and a sectional view of the connector 100b of the high-frequency signal transmission line 10.

The connector 100b, as shown by FIGS. 1, 4A and 4B, includes a connector body 102, external terminals 104 and 106, a central conductor 108 and an external conductor 110. The connector body 102 is in the shape of a combination of a rectangular or substantially rectangular plate-shaped portion and a cylindrical or substantially cylindrical portion. The connector body 102 is made of an insulating material such as resin.

The external terminal 104 is disposed on the negative z-axis surface of the plate-shaped portion of the connector body 102, in a position to be opposed to the external terminal 16b. The external terminals 106 are disposed on the negative z-axis surface of the plate-shaped portion of the connector body 102, in positions to be opposed to the exposed portions of the terminal portion 22c exposed through the openings Hf to Hh.

The central conductor 108 is disposed in the center of the cylindrical or substantially cylindrical portion of the connector body 102 and is connected to the external terminal 104. The central conductor 108 is a signal terminal at which a high-frequency signal is input or output. The external conductor 110 is disposed on an inner surface of the cylindrical or substantially cylindrical portion of the connector body 102 and is connected to the external terminals 106. The external conductor 110 is a grounding terminal maintained at a ground potential.

The connector 100b of the structure above is mounted on the connector portion 12c such that the external terminal 104 is connected to the external terminal 16b and that the external terminals 106 are connected to the terminal portion 22c. As a result, the signal line 20 is electrically connected to the central conductor 108. The ground conductors 22 and 24 are electrically connected to the external conductor 110.

Figure 5A:
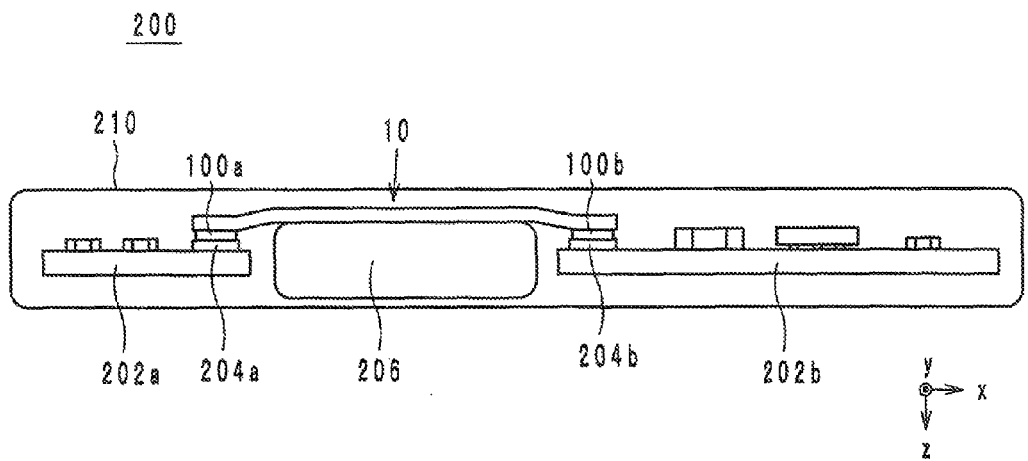
FIGS. 5A and 5B are plan views of an electronic device including the high-frequency signal transmission line, FIG. 5A being viewed from a y-axis direction, and FIG. 5B being viewed from a z-axis direction.
Figure 5B:
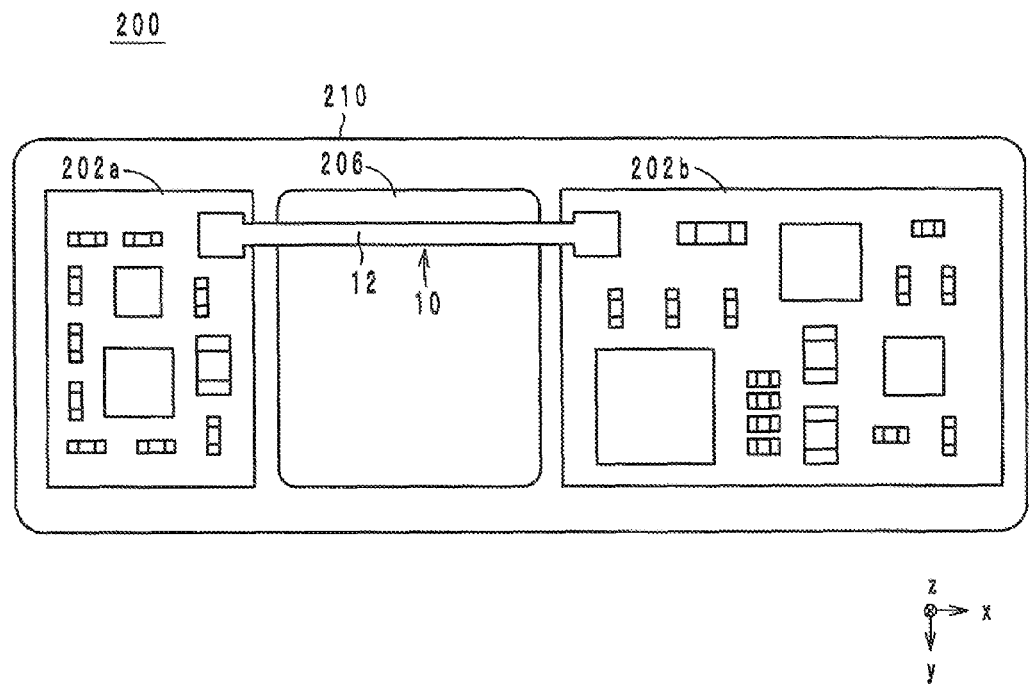

The high-frequency signal transmission line 10 is used as follows. FIG. 5 is a plan view of an electronic device 200 including the high-frequency signal transmission line 10, viewed from the y-axis direction.

The electronic device 200 includes a circuit boards 202a and 202b, receptacles 204a and 204b, a battery pack (metal object) 206 and a casing 210 besides the high-frequency signal transmission line 10.

The circuit board 202a includes, for example, a transmitting circuit or a receiving circuit including an antenna. The circuit board 202b includes, for example, a feed circuit. The battery pack 206 is, for example, a lithium-ion secondary battery, and the surface of the battery is covered by a metal cover. The circuit board 202a, the battery pack 206 and the circuit board 202b are arranged in this order from the negative x-axis side to the positive x-axis side.

The front surface of the dielectric body 12 (more exactly, the protective layer 14) is in contact with the battery pack 206. The front surface of the dielectric body 12 and the battery pack 206 are joined together by an adhesive or the like.

The receptacles 204a and 204b are placed on the negative z-axis surfaces of the circuit boards 202a and 202b, respectively. The connectors 100a and 100b are connected to the receptacles 204a and 204b, respectively. Thereby, a high-frequency signal, for example, with a frequency of 2 GHz transmitted between the circuit boards 202a and 202b is applied to the central conductors 108 of the connectors 100a and 100b via the receptacles 204a and 204b. In the meantime, the external conductors 110 of the connectors 100a and 100b are maintained at the ground potential via the circuit boards 202a and 202b, and the receptacles 204a and 204b. Thus, the high-frequency signal transmission line 10 connects the circuit boards 202a and 202b to each other.

There are level differences between the negative z-axis surface of the battery pack 206 and the receptacle 204a and between the negative z-axis surface of the battery pack 206 and the receptacle 204b. Therefore, the connectors 100a and 100b are connected to the receptacles 204a and 20b, respectively, with the line portion 12a of the dielectric body 12 bent at the both ends.

A manufacturing method of the high-frequency signal transmission line 10 is described with reference to FIG. 2. The following description is about a production of one high-frequency signal transmission line 10. Practically, however, large-size dielectric sheets are stacked into a laminate, and the laminate is cut into pieces, such that a plurality of high-frequency signal transmission lines 10 are produced at one time.

First, as the dielectric sheets 18, sheets of thermoplastic resin, each including a copper foil (metal film) spread on the entire front surface of the sheet, are prepared. The surfaces of the copper foils provided on the respective dielectric sheets 18 are, for example, plated with zinc for anticorrosion and are smoothened. The copper foils have a thickness within a range from about 10 μm to about 20 μm, for example.

Next, the external terminals 16a and 16b, and the ground conductor 22 as shown in FIG. 2 are provided on the front surface of one of the dielectric sheets 18 by photolithography, thus making the dielectric sheet 18 into the dielectric sheet 18a. More specifically, a resist corresponding to the shapes of the external terminals 16a, 16b and the main ground conductor 22 is printed on the copper foil on the front surface of the dielectric sheet 18a, and the copper foil is etched. As a result, the portions of the copper foil that are not covered by the resist are removed. Thereafter, the resist is removed. In this way, the external terminals 16a and 16b, and the ground conductor 22 are provided on the front surface of the dielectric sheet 18a as shown in FIG. 2.

Next, the connection conductors 25a and 25b as shown in FIG. 2 are provided on the front surface of another of the dielectric sheets 18 by photolithography, thus making the dielectric sheet 18 into the dielectric sheet 18b. The connection conductors 26a and 26b as shown in FIG. 2 are provided on the front surface of another of the dielectric sheets 18 by photolithography, thus making the dielectric sheet 18 into the dielectric sheet 18c. The signal line 20, and the connection conductors 27a and 27b as shown in FIG. 2 are provided on the front surface of another of the dielectric sheets 18 by photolithography, thus making the dielectric sheet 18 into the dielectric sheet 18d. The ground conductor 24 as shown in FIG. 2 is provided on the front surface of another of the dielectric sheets 18 by photolithography, thus making the dielectric sheet 18 into the dielectric sheet 18e. The photolithography for formation of these conductors is carried out in the same way as the photolithography for formation of the ground conductor 22 and the external terminals 16a and 16b, and therefore, a description thereof is omitted.

Next, through-holes are made in the dielectric sheets 18a to 18d by laser irradiation to the dielectric sheets 18a to 18d, at positions where the via-hole conductors B1 to B8 and b11 to b16 are to be formed, from the back side of the back surfaces of the dielectric sheets 18a to 18d. Thereafter, conductive paste is filled in the through-holes.

Next, the dielectric sheets 18a to 18e are stacked in this order from the positive z-axis side to the negative z-axis side. Heat and pressure are applied to the stacked dielectric sheets 18a to 18e from the positive z-axis side and the negative z-axis side, such that the dielectric sheets 18a to 18e are softened and compression-bonded to be unified. In the meantime, the conductive paste filled in the through-holes is solidified, such that the via-hole conductors B1 to B8 and b11 to b16 as shown in FIG. 2 are formed. However, the dielectric sheets 18 may be joined together by using an adhesive, such as epoxy resin, instead of using thermo-compression. The via-hole conductors B1 to B8 and b11 to b16 are not necessarily through-holes filled up with a conductive material entirely. The via-hole conductors B1 to B8 and b11 to b16 may be through-holes, for example, having a conductive material only on and along the inner surfaces of the respective through-holes.

Finally, resin (resist) paste is applied on the front surface of the dielectric sheet 18a, such that the protective layer 14 is formed.

Figure 15:
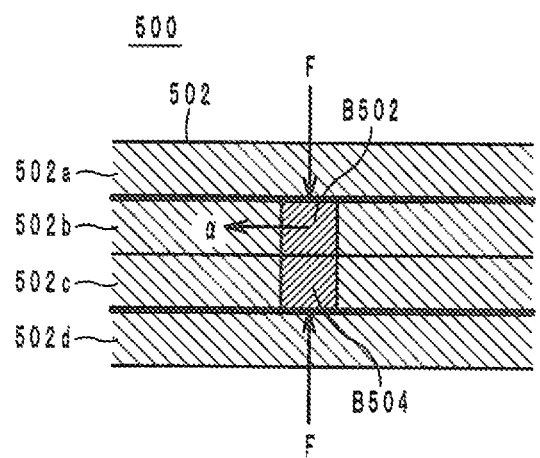
FIG. 15 is a sectional view of the via-hole conductors of the signal transmission line disclosed in WO2011/007660.

The high-frequency signal transmission line 10 of the structure above is flexible. In the signal transmission line disclosed in WO2011/007660, as shown by FIG. 15, a plurality of via-hole conductors B52 are connected to the respectively adjacent via-hole conductors 504 linearly. When the laminate body 502 is bent such that the center portion of the laminate body 502 will project upward, the upper insulating layer 502a is pulled to the right and left, and the lower insulating layer 502d is pressed from right and left. In this moment, with restoring force of the insulating layers 502a and 502d, the via-hole conductors B52 and B54 are forced from above and underneath as shown by arrows F. By the force F, the via-hole conductors B52 and B54 lean to right or left as shown by arrow α. In this way, the laminate body 502 is bent.

However, as shown in FIG. 15, the force F has almost no components to push the via-hole conductors B52 and B54 to right or left. Therefore, in order to tilt the via-hole conductors B52 and B54 to right or left, thus bending the laminate body 502, it is necessary to apply great force F to the via-hole conductors B52 and B54. Thus, the laminate body 502 of the signal transmission line 500 disclosed in WO2011/007660 is hard to bend. Also, due to the application of the great force F, the ground conductors may be cracked and/or disconnected, and/or the via-hole conductors B52 and B54 may be cracked, such that the signal transmission line 500 may be broken.

In the high-frequency signal transmission line 10, on the other hand, each of the interlayer connection portions C1 and C2 includes a series of via-hole conductors B1 to B4 or B5 or B8 pierced in the dielectric sheets 18a to 18d in the z-axis direction, and the series of via-hole conductors B1 to B4 or B5 to B8 includes two adjacent via-hole conductors that are pierced in two adjacent ones of the dielectric sheets 18 with respect to the z-axis direction and that have central axes located in different positions when viewed from the z-axis direction. In the high-frequency signal transmission line 10 according to this preferred embodiment, in each of the interlayer connection portion C1 and C2, the central axes of all of the via-hole conductors B1 to B4 or B5 to B8 are located in different positions when viewed from the z-axis direction. Accordingly, each of the interlayer connection portions C1 and C2 tilts when viewed from the y-axis direction. Therefore, when force F is applied to the interlayer connection portions C1 and C2 from the positive z-axis side, in the case shown by FIG. 3, moments to turn the respective interlayer connection portions C1 and C2 counterclockwise are generated. Consequently, the interlayer connection portions C1 and C2 lean, and the high-frequency signal transmission line 10 bends. Thus, the high-frequency signal transmission line 10 is flexible.

The high-frequency signal transmission line 10 is flexible also for the reason below. Specifically, in the high-frequency signal transmission line 10, in each of the interlayer connection portions C1, the via-hole conductors B1 to B4, of which central axes are located in different positions when viewed from the z-axis direction, are connected via the connection conductors 25a to 27a. In each of the interlayer connection portions C2, the via-hole conductors B5 to B8, of which central axes are located in different positions when viewed from the z-axis direction, are connected via the connection conductors 25b to 27b. The connection conductors 25a to 27a and 25b to 27d are layer conductors and therefore are more flexible than the pillar via-hole conductors B1 to B8. More specifically, the connection conductors 25a to 27a and 25b to 27b are more deformable in the thickness direction of the high-frequency signal transmission line 10, which is the bending direction of the high-frequency signal transmission line 10. Accordingly, when the high-frequency signal transmission line 10 is bent, the connection conductors 25a to 27 and 25b to 27b bend. Thus, the high-frequency signal transmission line 10 is flexible.

Figure 6:
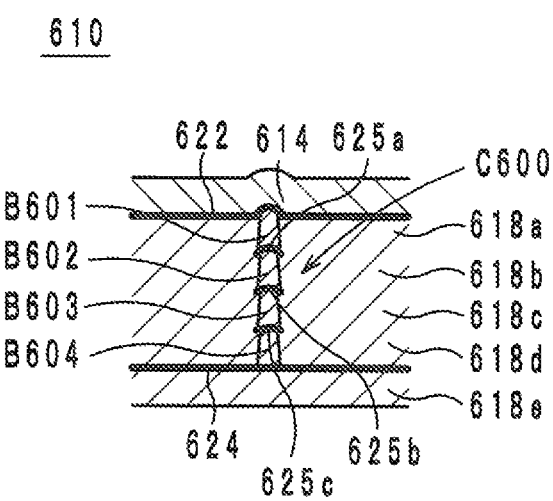
FIG. 6 is a sectional view of an interlayer connection portion of a high-frequency signal transmission line according to a comparative example.

In the high-frequency signal transmission line 10, the dielectric body 12 is inhibited from having protrusions on the front surface and the back surface, at the portions where the interlayer connection portions C1 and C2 are located. FIG. 6 is a sectional view of an interlayer connection portion C600 of a high-frequency signal transmission line 610 according to a comparative example.

In the high-frequency signal transmission line 610, the interlayer connection portion C600 is shaped straight by connecting via-holes B601 to B604 linearly. The via-hole conductors B601 to B604 are harder than dielectric sheets 618a to 618e. Therefore, when the dielectric sheets 618a to 618e are joined together by thermocompression bonding, protrusions are made on the front surface and the back surface of the high-frequency signal transmission line 610, at the portions where the via-hole conductors B601 to B604 are located.

In the high-frequency signal transmission line 10, on the other hand, each of the interlayer connection portions C1 and C2 includes a series of via-hole conductors B1 to B4 or B5 to B8, and in each of the interlayer connection portions C1 and C2, the series of via-hole conductors B1 to B4 or B5 to B8 includes two adjacent via-hole conductors that are pierced in two adjacent ones of the dielectric sheets 18a to 18d with respect to the z-axis direction and that have central axes located in different positions when viewed from the z-axis direction. Thus, in the high-frequency signal transmission line 10, the connection of the adjacent via-hole conductors B1 to B4 and the connection of the adjacent via-hole conductors B5 to B8 are not straight. As a result, the dielectric body 12 is inhibited from having protrusions on the front surface and the back surface, at the portions where the interlayer connection portions C1 and C2 are located.

When the high-frequency signal transmission line 10 is bent, the connection conductors 25a to 27a and 25b to 27b bend, which reduces the force applied to the via-hole conductor B1 to B8 at this time. Accordingly, the restoring force of the via-hole conductors B1 to B8 from the bent state is inhibited from being transmitted to the surrounding dielectric sheets 18a to 18d and the surrounding ground conductors 22 and 24. Therefore, breakage of the dielectric sheets 18a to 18d and/or the ground conductors 22 and 24 is prevented. Thus, the insertion loss of the high-frequency signal transmission line 10 can be reduced.

Also, the high-frequency signal transmission line 10 can inhibit unnecessary radiation. In the signal transmission line 500 disclosed in WO2011/007660, a plurality sets of linearly connected via-hole conductors B52 and B54 are arranged along a signal line. In this structure, it is likely that unnecessary radiation occurs among the sets of via-hole conductors B52 and B54.

In the high-frequency signal transmission line 10, on the other hand, each of the interlayer connection portions C1 and C2 includes a series of via-hole conductors B1 to B4 or B5 to B8, and in each of the interlayer connection portions C1 and C2, the series of via-hole conductors B1 to B4 or B5 to B8 includes two adjacent via-hole conductors that are pierced in two adjacent ones of the dielectric sheets 18a to 18d with respect to the z-axis direction and that have central axes located in different positions when viewed from the z-axis direction. Thus, in the high-frequency signal transmission line 10, the connection of the adjacent via-hole conductors B1 to B4 and the connection of the adjacent via-hole conductors B5 to B8 are not straight. Accordingly, the size in the x-axis direction (width) of the interlayer connection portions C1 and C2 is greater than the size in the x-axis direction of the sets of linearly connected via-hole conductors B52 and B54. Therefore, noise radiated from the signal line 20 is likely to be absorbed in the via-hole conductors B1 to B8 of the interlayer connection portions C1 and C2. Thus, the high-frequency signal transmission line 10 inhibits unnecessary radiation from the positive and negative y-axis side surfaces.

In the high-frequency signal transmission line 10, noise radiated from the signal line 20 is also absorbed by the connection conductors 25a to 27a and 25b to 27b. Thus, due to the connection conductors 25a to 27a and 25b to 27b, the inhibition of unnecessary radiation from the positive and negative y-axis side surfaces becomes more effective.

In the high-frequency signal transmission line 10, the interlayer connection portions C1 and C2 are connected to the ground conductor 24 at the bridges 60 among the openings 30. Thereby, the bridges 60 are almost maintained at the ground potential, and generation of unnecessary inductor components on the bridges 60 is inhibited.

In the high-frequency signal transmission line 10, the characteristic impedance of the signal line 20 in the areas A1 is higher than that in the areas A3 and A4. Also, the characteristic impedance of the signal line 20 in the areas A3 and A4 is higher than that in the areas A2. Specifically, as will be described later, in a range between two adjacent bridges 60, with increasing distance from one of the bridges 60 and with decreasing distance from the other bridge 60, the characteristic impedance of the signal line 20 increases from a minimum value Z2, an intermediate value Z3 to a maximum value Z1, and thereafter decreases from the maximum value Z1, the intermediate value Z3 and to the maximum value Z2.

The size in the y-axis direction (width) W1 of the opening portions 30b is greater than the size in the y-axis direction (width) W2 of the opening portions 30a and 30c. Accordingly, the distance between the signal line 20 and the ground conductor 24 in the areas A1 is greater than the distance between the signal line 20 and the ground conductor 24 in the areas A3 and A4. Therefore, the strength of magnetic field generated by the signal line 20 in the areas A1 is greater than that in the areas A3 and A4. Thus, the inductance of the signal line 20 is great in the areas A1. That is, in the areas A1, the signal line 20 is dominantly inductive.

On the other hand, the distance between the signal line 20 and the ground conductor 24 in the areas A2 is smaller than that in the areas A3 and A4. Accordingly, the capacitance between the signal line 20 and the ground conductor 24 in the areas A2 is greater than that in the areas A3 and A4. Also, the magnetic field strength in the areas A2 is smaller than that in the areas A3 and A4. Thus, in the areas A2, the signal line 20 is dominantly capacitive.

As described above, in the areas A1, almost no capacitance is generated between the signal line 20 and the ground conductor 24, and dominantly from the inductance of the signal line 20, the characteristic impedance of the signal line 20 results in the maximum value Z1. In the areas A2, large capacitance is generated between the signal line 20 and the ground conductor 24, and dominantly from the capacitance, the characteristic impedance of the signal line 20 results in the minimum value Z2. In the areas A3 and A4, from inductance and capacitance, the characteristic impedance of the signal line 20 results in the intermediate value Z3. Hence, the characteristic impedance of the signal line 20 changes periodically so as to decrease from the maximum value Z1, the intermediate value Z3 and to the minimum value Z2, and thereafter to increase from the minimum value Z2, the intermediate value Z3 and to the maximum value Z1. The maximum value Z1 is, for example, about 70Ω. The minimum value Z2 is, for example, about 30Ω. The intermediate value Z3 is, for example, about 50Ω. The maximum value Z1, the minimum value Z2 and the intermediate value Z3 are set such that the characteristic impedance of the entire signal line 20 will be a desired value (for example, about 50Ω).

In the high-frequency signal transmission line 10, the ground conductor 24 is maintained stably at the ground potential. As a result, the transmission loss can be reduced, and the shield property is improved. In the high-frequency signal transmission line 10, the size in the y-axis direction (width) W1 of the opening portions 30b is greater than the size in the y-axis direction W2 of the opening portions 30a and 30c. In the high-frequency signal transmission line 10, the magnetic energy of the signal line 20 in the areas A1 is higher than that in the areas A3 and A4. The magnetic energy of the signal line 20 in the areas A2 is lower than that in the areas A3 and A4. Accordingly, the characteristic impedance of the signal line changes from Z2, Z3, Z1, Z3, Z2, . . . repeatedly. Therefore, a change in magnetic energy of the signal line 20 with a change from an area to the next area in the x-axis direction is gradual. Consequently, the magnetic energy at the borders among the openings 30 and the bridges 60 is low, and the ground conductor 24 is inhibited from shifting the potential from the ground potential. As a result, generation of unnecessary radiation and a transmission loss of a high-frequency signal can be inhibited.

First Modification

Figure 7:
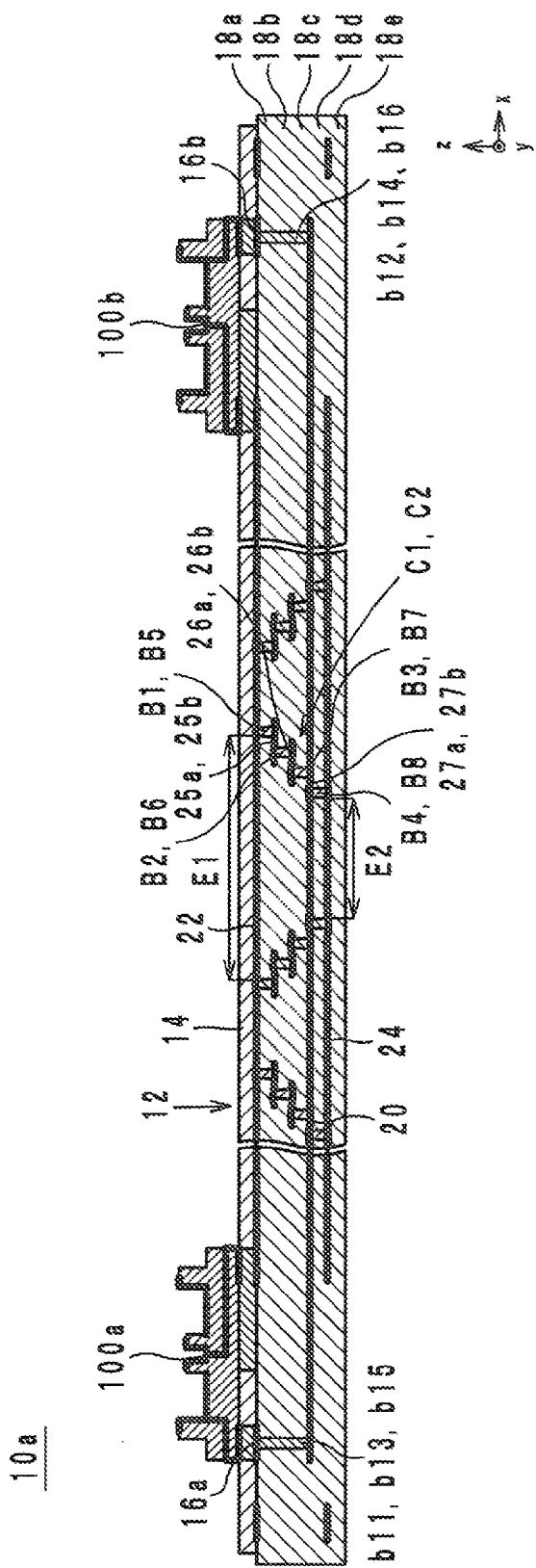
FIG. 7 is a sectional view of a high-frequency signal transmission line according to a first modification of a preferred embodiment of the present invention.

Next, a high-frequency signal transmission line 10a according to a first modification of a preferred embodiment of the present invention is described with reference to the drawings. FIG. 7 is a sectional view of the high-frequency signal transmission line 10a according to the first modification. In FIG. 7, the via-hole conductors B1 and B5 are shown in the same position, the via-hole conductors B2 and B6 are shown in the same position, the via-hole conductors B3 and B7 are shown in the same position, and the via-hole conductors B4 and B8 are shown in the same position. The connection conductors 25a and 25b are shown in the same position, the connection conductors 26a and 26b are shown in the same position, and the connection conductors 27a and 27b are shown in the same position.

In the high-frequency signal transmission line 10, all of the interlayer connection portions C1 and C2 preferably tilt in the same direction, when viewed from the y-axis direction. In the high-frequency signal transmission line 10a, however, each of the interlayer connection portions C1, when viewed from the y-axis direction, tilts in the opposite x-axis direction to its adjacent interlayer connection portion C1 in the x-axis direction, and each of the interlayer connection portions C2, when viewed from the y-axis direction, tilts in the opposite x-axis direction to its adjacent interlayer connection portion C2 in the x-axis direction. The high-frequency signal transmission line 10a of the structure above has the same advantageous effects as the high-frequency signal transmission line 10.

However, the ground conductors 22 and 24 of the high-frequency signal transmission line 10 is maintained at the ground potential more stably than the ground conductors 22 and 24 of the high-frequency signal transmission line 10a. In the high-frequency signal transmission line 10a, each of the interlayer connection portions C1, when viewed from the y-axis direction, tilts in the opposite x-axis direction to its adjacent interlayer connection portion C1 in the x-axis direction, and each of the interlayer connection portions C2, when viewed from the y-axis direction, tilts in the opposite x-axis direction to its adjacent interlayer connection portion C2 in the x-axis direction. Therefore, as shown in FIG. 7, there are relatively long intervals E1 and relatively short intervals E2 in the x-axis direction among the interlayer connection portions C1 and among the interlayer connection portions C2. In the intervals E2, the ground conductors 22 and 24 are stably maintained at the ground potential, and in the intervals E1, the ground conductors 22 and 24 are less stably maintained at the ground potential. Therefore, the high-frequency signal transmission line 10a is likely to generate unnecessary radiation more from the intervals E1, compared with the high-frequency signal transmission line 10.

In the high-frequency signal transmission line 10, on the other hand, as shown in FIG. 3, the interlayer connection portions C1, which are arranged in the x-axis direction, tilt in the same direction when viewed from the y-axis direction, and the interlayer connection portions C2, which are arranged in the x-axis direction, tilt in the same direction when viewed from the y-axis direction. Therefore, the intervals among the interlayer connection portions C1 in the x-axis direction are uniform, and the intervals among the interlayer connection portions C2 in the x-axis direction are uniform. As a result, in the high-frequency signal transmission line 10, potential unevenness is less likely to occur on the ground conductor 22 and on the ground conductor 24, and the ground conductors 22 and 24 are stably maintained at the ground potential. Therefore, the high-frequency signal transmission line 10 is less likely to generate unnecessary radiation.

Second Modification

Figure 8:
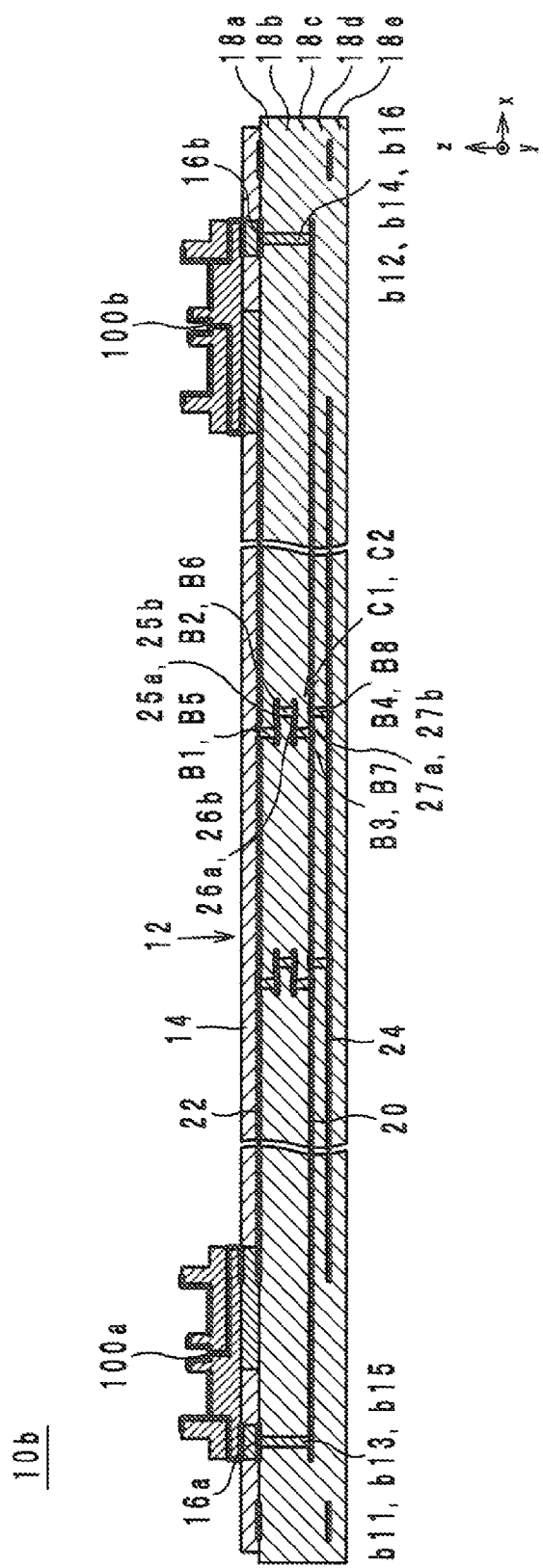
FIG. 8 is a sectional view of a high-frequency signal transmission line according to a second modification of a preferred embodiment of the present invention.

Next, a high-frequency signal transmission line 10b according to a second modification of a preferred embodiment of the present invention is described with reference to the drawings. FIG. 8 is a sectional view of the high-frequency signal transmission line 10b according to the second modification. In FIG. 8, the via-hole conductors B1 and B5 are shown in the same position, the via-hole conductors B2 and B6 are shown in the same position, the via-hole conductors B3 and B7 are shown in the same position, and the via-hole conductors B4 and B8 are shown in the same position. The connection conductors 25a and 25b are shown in the same position, the connection conductors 26a and 26b are shown in the same position, and the connection conductors 27a and 27b are shown in the same position.

In the high-frequency signal transmission line 10b, each of the interlayer connection portions C1 and C2 has a zigzag configuration. More specifically, in each of the interlayer connection portions C1, when viewed from the z-axis direction, the central axes of the via-hole conductors B1 and B3 are in the same position, and the central axes of the via-hole conductors B2 and B4 are in the same position. The central axes of the via-hole conductors B1 and B3 are located at the negative x-side of the central axes of the via-hole conductors B2 and B4. Likewise, in each of the interlayer connection portions C2, when viewed from the z-axis direction, the central axes of the via-hole conductors B5 and B7 are in the same position, and the central axes of the via-hole conductors B6 and B8 are in the same position. The central axes of the via-hole conductors B5 and B7 are located at the negative x-side of the central axes of the via-hole conductors B6 and B8. The high-frequency signal transmission line 10b of the structure above has the same advantageous effects as the high-frequency signal transmission line 10.

Third Modification

Figure 9:
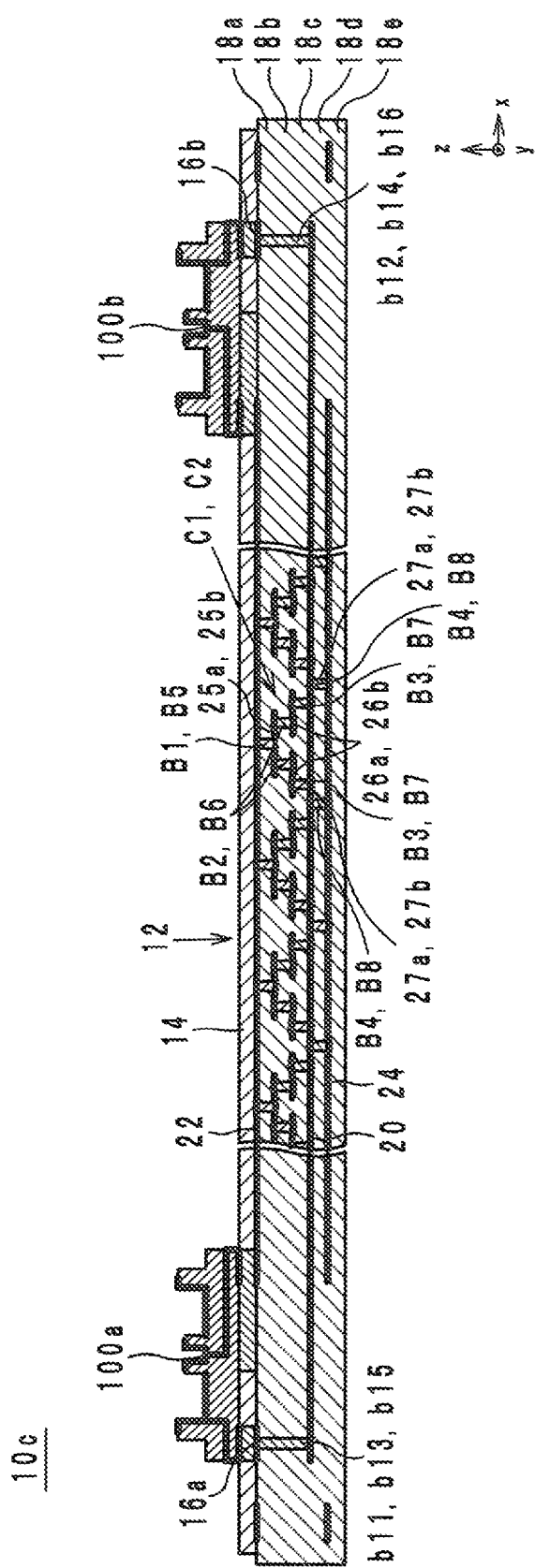
FIG. 9 is a sectional view of a high-frequency signal transmission line according to a third modification of a preferred embodiment of the present invention.

Next, a high-frequency signal transmission line 10c according to a third modification of a preferred embodiment of the present invention is described with reference to the drawings. FIG. 9 is a sectional view of the high-frequency signal transmission line 10c according to the third modification. In FIG. 9, the via-hole conductors B1 and B5 are shown in the same position, the via-hole conductors B2 and B6 are shown in the same position, the via-hole conductors B3 and B7 are shown in the same position, and the via-hole conductors B4 and B8 are shown in the same position. The connection conductors 25a and 25b are shown in the same position, the connection conductors 26a and 26b are shown in the same position, and the connection conductors 27a and 27b are shown in the same position.

In the high-frequency signal transmission line 10c, each of the interlayer connection portions C1, when viewed from the y-axis direction, tilts in the opposite x-axis direction to its adjacent interlayer connection portion C1 in the x-axis direction, and each of the interlayer connection portions C2, when viewed from the y-axis direction, tilts in the opposite x-axis direction to its adjacent interlayer connection portion C2 in the x-axis direction. Further, two interlayer connection portions C1 that are adjacent to each other in the x-axis direction share a via-hole conductor B1 and a via-hole conductor B4, and two interlayer connection portions C2 that are adjacent to each other in the x-axis direction share a via-hole conductor B5 and a via-hole conductor B8. In other words, one via-hole conductor B1 diverges into two adjacent interlayer connection portions C1 in the x-axis direction, and one via-hole conductor B5 diverges into two adjacent interlayer connection portions C2 in the x-axis direction. Also, one via-hole conductor B4 diverges into two adjacent interlayer connection portions C1 in the x-axis direction diverge, and one via-hole conductor B8 diverges into two adjacent interlayer connection portions C2 in the x-axis direction. The high-frequency signal transmission line 10c of the structure above has the same advantageous effects as the high-frequency signal transmission line 10. Further, the high-frequency signal transmission line 10c prevents unnecessary radiation from the negative y-axis and the positive y-axis side surfaces more effectively than the high-frequency signal transmission line 10.

Fourth Preferred Embodiment

Figure 10:
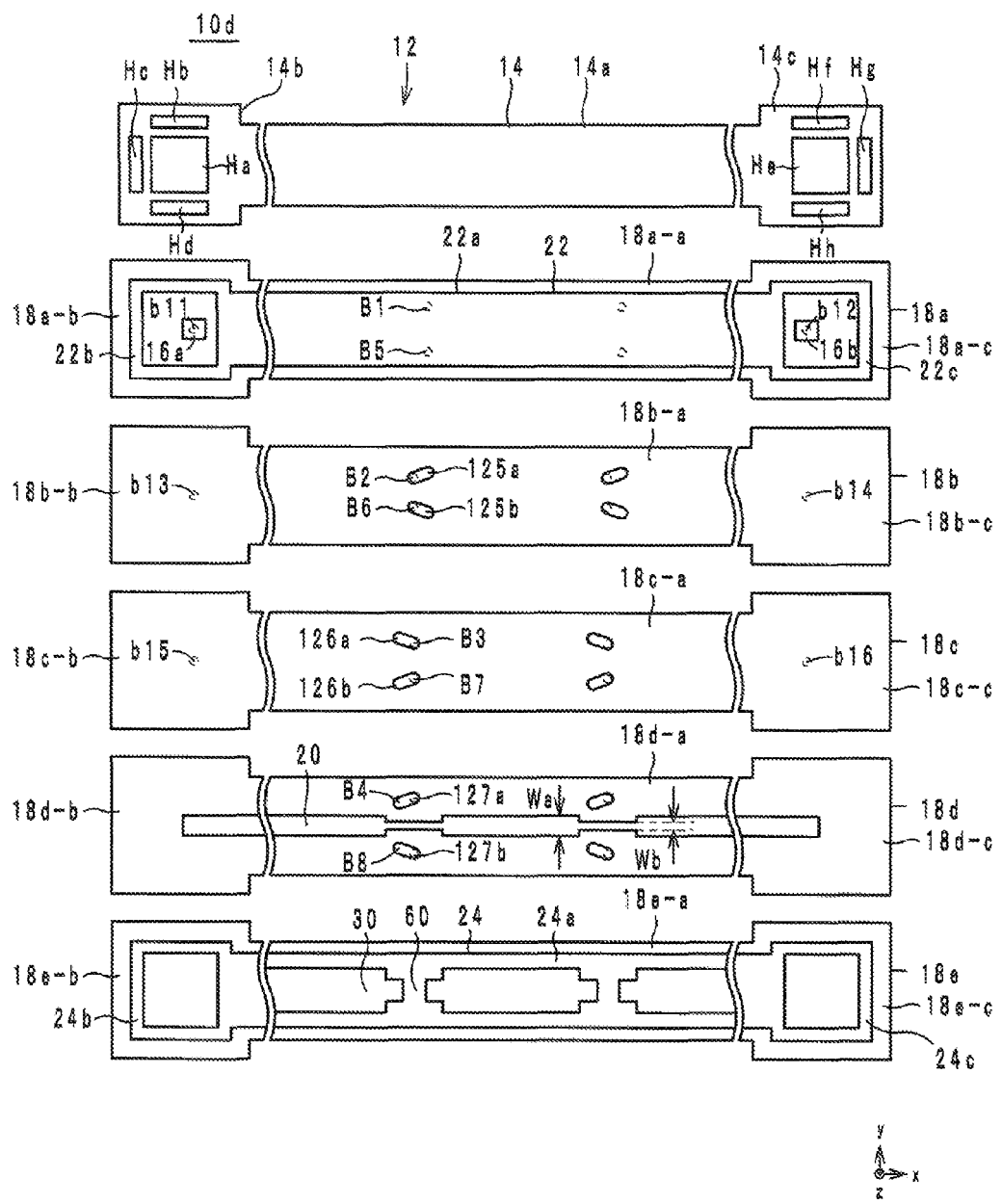
FIG. 10 is an exploded view of a dielectric body of a high-frequency signal transmission line according to a fourth modification of a preferred embodiment of the present invention.
Figure 11:
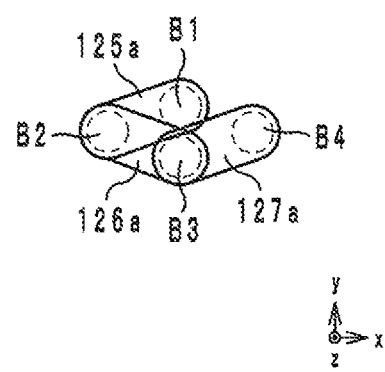
FIG. 11 is a transparent view from the z-axis direction, showing an interlayer connection portion of the high-frequency signal transmission line according to the fourth preferred embodiment of the present invention.

Next, a high-frequency signal transmission line 10d according to a fourth preferred embodiment of the present invention is described with reference to the drawings. FIG. 10 is an exploded view of the dielectric body 12 of the high-frequency signal transmission line 10d. FIG. 11 is a transparent view from the z-axis direction, showing one of the interlayer connection portions C1 of the high-frequency signal transmission line 10d.

In the high-frequency signal transmission line 10d, in each of the interlayer connection portions C1, the via-hole conductors B1 to B4 are not arranged in a line along the x-axis, and in each of the interlayer connection portions C2, the via-hole conductors B5 to B8 are not arranged in a line along the x-axis. Each of the interlayer connection portions C1 and C2 has a spiral shape.

More specifically, in each of the interlayer connection portions C1, when viewed from the z-axis direction, the via-hole conductors B1 to B4 are located on the four corners of a rhombus having a diagonal line in parallel to the x-axis direction and a diagonal line in parallel or substantially in parallel to the y-axis direction. The via-hole conductor B1 is located on the corner at the positive y-axis side of the rhombus. The via-hole conductor B2 is located on the corner at the negative x-axis side of the rhombus. The via-hole conductor B3 is located on the corner at the negative y-axis side of the rhombus. The via-hole conductor B4 is located on the corner at the positive x-axis side of the rhombus.

The via-hole conductors B1 and B2 are connected via a connection conductor 125a. The via-hole conductors B2 and B3 are connected via a connection conductor 126a. The via-hole conductors B3 and B4 are connected via a connection conductor 127a.

In each of the interlayer connection portions C2, when viewed from the z-axis direction, the via-hole conductors B5 to B8 are located on the four corners of a rhombus having a diagonal line in parallel or substantially in parallel to the x-axis direction and a diagonal line in parallel or substantially in parallel to the y-axis direction. The via-hole conductor B5 is located on the corner at the positive y-axis side of the rhombus. The via-hole conductor B6 is located on the corner at the negative x-axis side of the rhombus. The via-hole conductor B7 is located on the corner at the negative y-axis side of the rhombus. The via-hole conductor B8 is located on the corner at the positive x-axis side of the rhombus.

The via-hole conductors B5 and B6 are connected via a connection conductor 125b. The via-hole conductors B6 and B7 are connected via a connection conductor 126b. The via-hole conductors B7 and B8 are connected via a connection conductor 127b.

The high-frequency signal transmission line 10d has the same advantageous effects as the high-frequency signal transmission line 10.

Fifth Modification

Figure 12:
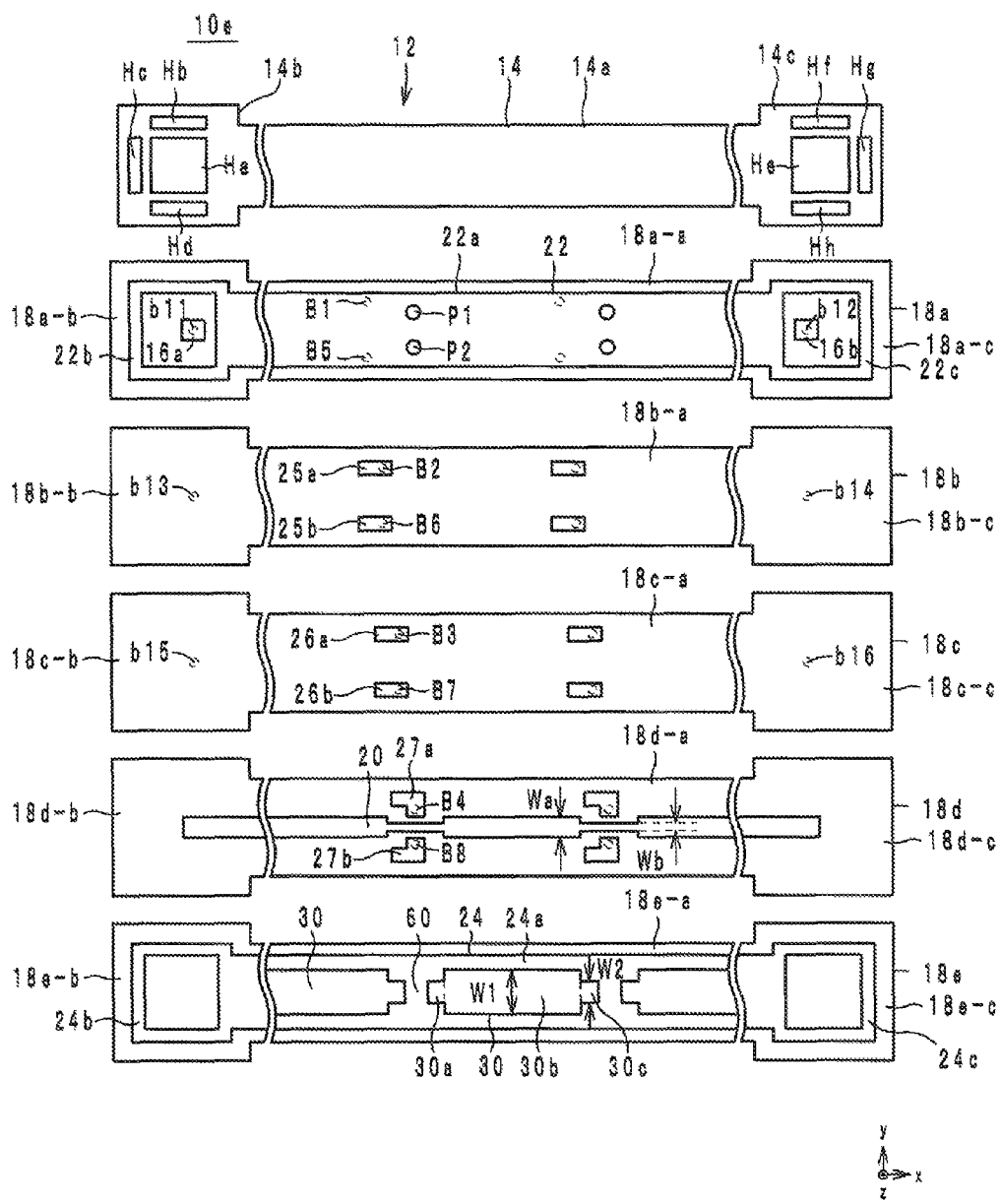
FIG. 12 is an exploded view of a dielectric body of a high-frequency signal transmission line according to a fifth modification of a preferred embodiment of the present invention.
Figure 13:
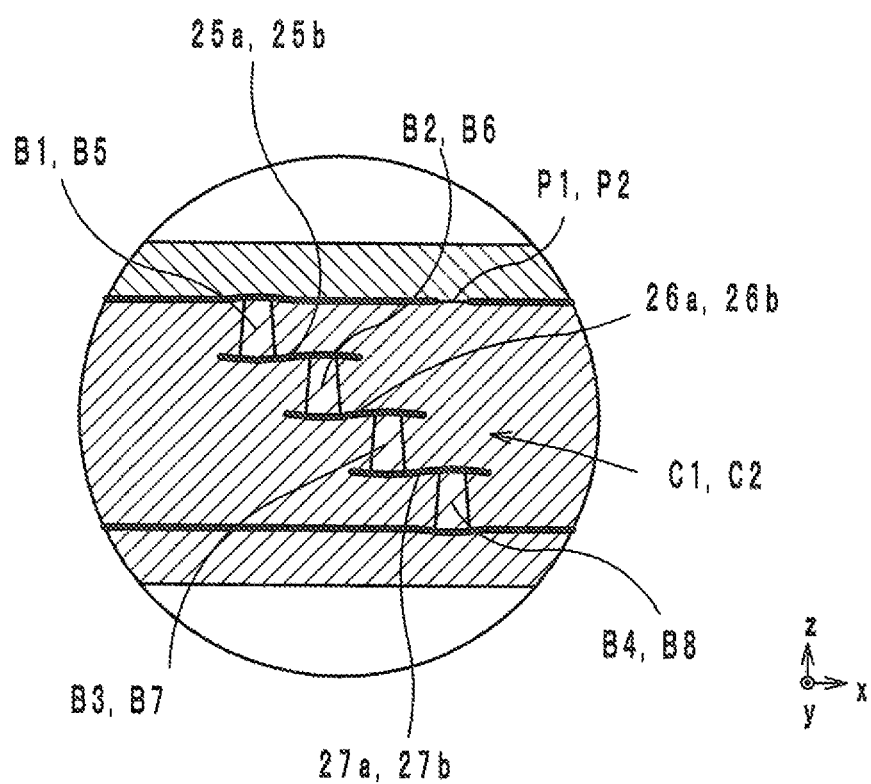
FIG. 13 is a sectional view of the high-frequency signal transmission line according to the fifth modification of a preferred embodiment of the present invention.

Next, a high-frequency signal transmission line 10e according to a fifth modification of a preferred embodiment of the present invention is described with reference to the drawings. FIG. 12 is an exploded view of the dielectric body 12 of the high-frequency signal transmission line 10e according to the fifth modification. FIG. 13 is a sectional view of the high-frequency signal transmission line 10e according to the fifth modification.

In the high-frequency signal transmission line 10e, the ground conductor 22 has conductor-missing portions P1 and P2 in positions where the interlayer connection portions C1 and C2 are connected to the ground conductor 24, when viewed from the z-axis direction.

The high-frequency signal transmission line 10e of the structure above has the same advantageous effects as the high-frequency signal transmission line 10. In the high-frequency signal transmission line 10e, the conductor-missing portions P1 and P2 are located in positions where the via-hole conductors B4 and B8 are located, thus preventing the dielectric body 12 from having projections on the front and the back surfaces. Thus, the dielectric body 12 can be made thinner by the thickness of the ground conductors 22.

Sixth Modification

Figure 14:
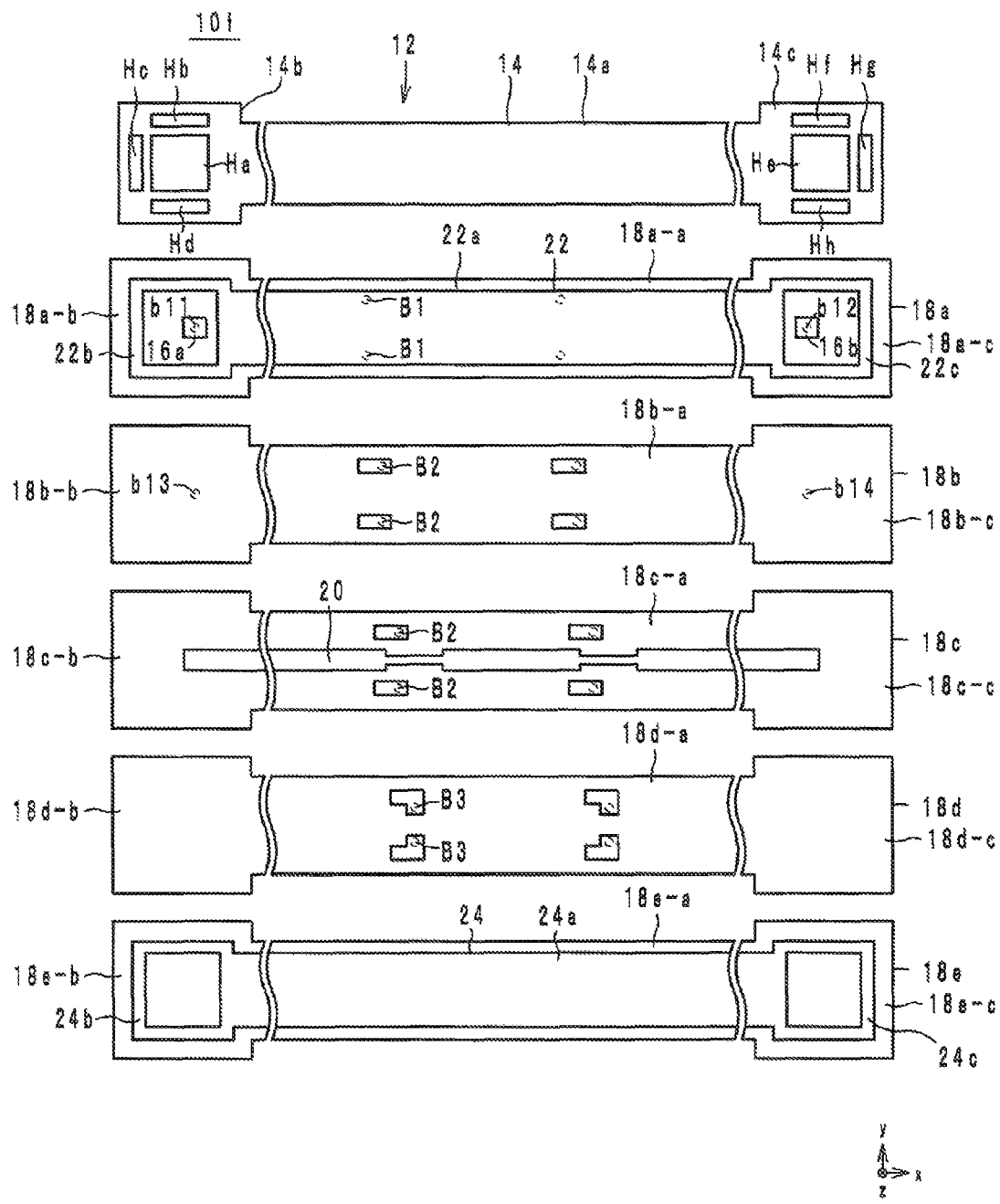
FIG. 14 is an exploded view of a dielectric body of a high-frequency signal transmission line according to a sixth modification of a preferred embodiment of the present invention.

Next, a high-frequency signal transmission line 10f according to a sixth modification of a preferred embodiment of the present invention is described with reference to the drawings. FIG. 14 is an exploded view of the high-frequency signal transmission line 10f according to the sixth modification.

In the high-frequency signal transmission line 10f, as shown in FIG. 14, the ground conductor 24 does not have openings 30. In this case, in order to reduce the capacitance between the signal line 20 and the ground conductor 24, the signal line 20 is provided on the front surface of the dielectric sheet 18c.

Other Preferred Embodiments

High-frequency signal transmission lines according to the present invention are not limited to the high-frequency signal transmission lines 10 and 10a to 10f described above, and various changes and modifications may be possible within the scope of the present invention.

In each of the interlayer connection portions C1 and C2, for example, the via-hole conductors B1 to B4 or B5 to B8 may be located such that the central axes of the via-hole conductors B1 and B2 or B5 and B6 are in the same position when viewed from the z-axis direction and the central axes of the via-hole conductors B2, B3 and B4, or B6, B7 and B8 are in different positions when viewed from the z-axis direction. In other words, in each of the interlayer connection portions C1 and C2, the via-hole conductors may include both two adjacent via-hole conductors that are pierced in two adjacent dielectric sheets 18 with respect to the z-axis direction and that have central axes located in the same position when viewed from the z-axis direction and two adjacent via-hole conductors that are pierced in adjacent dielectric sheets 18 with respect to the z-axis direction and that have central axes located in different positions when viewed from the z-axis direction. Thus, in each of the interlayer connection portions C1 and C2 including a series of via-hole conductors B1 to B4 or B5 to B8, it is only necessary that the central axes of two adjacent ones of the via-hole conductors B1 to B4 or B5 to B6 pierced in two adjacent ones of the dielectric sheets 18a to 18d are located in the same position when viewed from the z-axis direction.

The connection conductors 25a to 27a and 25b to 27b are not indispensable. In a case where the connection conductors 25a to 27a and 25b to 27b are not provided, the via-hole conductors B1 to B4 are connected directly with their respective central axes shifted from each other, and the via-hole conductors B5 to B8 are connected directly with their respective central axes shifted from each other.

The ground conductor 24 may be arranged on the dielectric sheet 18d so as to extend in the x-axis direction along the signal line 20 at both y-axis sides of the signal line 20.

Combination of the structures of the high-frequency signal transmission lines 10 and 10a to 10f are possible.

Each of the high-frequency signal transmission lines 10 and 10a to 10f may be used as a high-frequency signal transmission line in an RF circuit board such as an antenna front-end module or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line comprising:
a flexible body including a plurality of insulating layers stacked on each other;
a linear signal line located in or on the body;
a first ground conductor opposed to the signal line via at least one of the insulating layers;
a second ground conductor extending along the signal line; and
an interlayer connection portion that connects the first ground conductor and the second ground conductor, the interlayer connection portion including a plurality of interlayer connection conductors individually pierced in some of the insulating layers and connected to each other, the plurality of interlayer connection conductors including two interlayer connection conductors that are pierced in two adjacent ones of the insulating layers with respect to a layer-stacking direction and that have central axes located in different positions when viewed from the layer-stacking direction.

2. The high-frequency signal transmission line according to claim 1, wherein in the interlayer connection portion, the central axis of each of the interlayer connection conductors is located in a different position from the central axis of its adjacent one of the interlayer connection conductors when viewed from the layer-stacking direction.

3. The high-frequency signal transmission line according to claim 1, wherein the first ground conductor includes a conductor-missing portion in a position where the interlayer connection portion is connected to the second ground conductor when viewed from the layer-stacking direction.

4. The high-frequency signal transmission line according to claim 1, wherein:
a plurality of interlayer connection portions are provided; and
all of the interlayer connection portions tilt in a same direction when viewed from a direction perpendicular or substantially perpendicular to the layer-stacking direction and the extending direction of the signal line.

5. The high-frequency signal transmission line according to claim 1, wherein the second ground conductor is located on an opposite side of the signal line from the first ground conductor, and is opposed to the signal line via at least one of the insulating layers.

6. The high-frequency signal transmission line according to claim 5, wherein:
the second ground conductor includes a plurality of openings arranged along the signal line; and
the interlayer connection portion is connected to the second ground conductor in an area between adjacent ones of the openings.

7. The high-frequency signal transmission line according to claim 1, wherein in the interlayer connection portion, the central axes of two arbitrary adjacent ones of the interlayer connection conductors pierced in two adjacent ones of the insulating layers are located in different positions when viewed from the layer-stacking direction.

8. The high-frequency signal transmission line according to claim 7, wherein in the interlayer connection portion, the central axes of all of the interlayer connection conductors are located in different positions when viewed from the layer-stacking direction.

9. The high-frequency signal transmission line according to claim 7, wherein in the interlayer connection portion, the central axes of all of the interlayer connection conductors are arranged in a line in an extending direction of the signal line when viewed from the layer-stacking direction.

10. The high-frequency signal transmission line according to claim 1, wherein:
the flexible body includes an elongated line portion and a connecting portion connected to an end of the line portion and having a greater width than the line portion in a direction perpendicular to a lengthwise direction of the line portion; and
an external terminal is electrically connected to the signal line and provided on the connecting portion.

11. The high-frequency signal transmission line according to claim 10, further comprising a connector connected to the external terminal.

12. The high-frequency signal transmission line according to claim 10, wherein:
the interlayer connection portion includes a plurality of interlayer connection portions arranged on a side of the signal line with respect to a widthwise direction of the signal line when viewed from the layer-stacking direction; and
each of the plurality of interlayer connection portions includes a connection conductor located on one of the insulating layers to connect the two interlayer connection conductors that have central axes located in different positions when viewed from the layer-stacking direction; and
at least two separate conductors provided on the one of the insulating layers serve as the connection conductors of the plurality of interlayer connection portions.

13. The high-frequency signal transmission line according to claim 12, wherein:
each of the plurality of interlayer connection portions includes the interlayer connection conductors and the connection conductor connected alternately, thereby serving as one connection path between the first ground conductor and the second ground conductor; and
the respective connection conductors of the plurality of interlayer connection portions located on the one of the insulating layers are physically separate from each other.

14. An electronic device comprising:
a high-frequency signal transmission line; and
a casing encasing the high-frequency signal transmission line; wherein
the high-frequency signal transmission line includes:
a flexible body including a plurality of insulating layers stacked on each other;
a linear signal line located in or on the body;
a first ground conductor opposed to the signal line via at least one of the insulating layers;
a second ground conductor extending along the signal line; and
an interlayer connection portion that connects the first ground conductor and the second ground conductor, the interlayer connection portion including a plurality of interlayer connection conductors individually pierced in some of the insulating layers and connected to each other, the plurality of interlayer connection conductors including two interlayer connection conductors that are pierced in two adjacent ones of the insulating layers with respect to a layer-stacking direction and that have central axes located in different positions when viewed from the layer-stacking direction.

15. The electronic device according to claim 14, wherein in the interlayer connection portion, the central axis of each of the interlayer connection conductors is located in a different position from the central axis of its adjacent one of the interlayer connection conductors when viewed from the layer-stacking direction.

16. The electronic device according to claim 14, wherein the interlayer connection portion includes a connection conductor located on one of the insulating layers to connect the at least two interlayer connection conductors that have central axes located in different positions when viewed from the layer-stacking direction.

17. The electronic device according to claim 14, wherein the first ground conductor includes a conductor-missing portion in a position where the interlayer connection portion is connected to the second ground conductor when viewed from the layer-stacking direction.

18. The electronic device according to claim 14, wherein:
a plurality of interlayer connection portions are provided; and
all of the interlayer connection portions tilt in a same direction when viewed from a direction perpendicular or substantially perpendicular to the layer-stacking direction and the extending direction of the signal line.

19. The electronic device according to claim 14, wherein the second ground conductor is located on an opposite side of the signal line from the first ground conductor, and is opposed to the signal line via at least one of the insulating layers.

20. The electronic device according to claim 19, wherein:
the second ground conductor includes a plurality of openings arranged along the signal line; and
the interlayer connection portion is connected to the second ground conductor in an area between adjacent ones of the openings.

21. The electronic device according to claim 14, wherein in the interlayer connection portion, the central axes of two arbitrary adjacent ones of the interlayer connection conductors pierced in two adjacent ones of the insulating layers are located in different positions when viewed from the layer-stacking direction.

22. The electronic device according to claim 21, wherein in the interlayer connection portion, the central axes of all of the interlayer connection conductors are located in different positions when viewed from the layer-stacking direction.

23. The electronic device according to claim 21, wherein in the interlayer connection portion, the central axes of all of the interlayer connection conductors are arranged in a line in an extending direction of the signal line when viewed from the layer-stacking direction.

24. The electronic device according to claim 14, wherein:
the flexible body includes an elongated line portion and a connecting portion connected to an end of the line portion and having a greater width than the line portion in a direction perpendicular to a lengthwise direction of the line portion; and
an external terminal is electrically connected to the signal line and provided on the connecting portion.

25. The electronic device according to claim 24, further comprising a connector connected to the external terminal.

26. The electronic device according to claim 24, wherein:
the interlayer connection portion includes a plurality of interlayer connection portions arranged on a side of the signal line with respect to a widthwise direction of the signal line when viewed from the layer-stacking direction; and
each of the plurality of interlayer connection portions includes a connection conductor located on one of the insulating layers to connect the two interlayer connection conductors that have central axes located in different positions when viewed from the layer-stacking direction; and
at least two separate conductors provided on the one of the insulating layers serve as the connection conductors of the plurality of interlayer connection portions.

27. The electronic device according to claim 26, wherein:
each of the plurality of interlayer connection portions includes the interlayer connection conductors and the connection conductor connected alternately, thereby serving as one connection path between the first ground conductor and the second ground conductor; and
the respective connection conductors of the plurality of interlayer connection portions located on the one of the insulating layers are physically separate from each other.

* * * * *